United States Patent
Iwasaka et al.

(10) Patent No.: US 10,290,662 B2
(45) Date of Patent: May 14, 2019

(54) MANUFACTURING METHOD OF SUBSTRATE FOR DISPLAY DEVICE AND MANUFACTURING METHOD OF DISPLAY DEVICE

(71) Applicant: MITSUBISHI ELECTRIC CORPORATION, Tokyo (JP)

(72) Inventors: Toshihiko Iwasaka, Kumamoto (JP); Yusuke Yamagata, Tokyo (JP); Kazunori Inoue, Kikuchi (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/363,083

(22) Filed: Nov. 29, 2016

(65) Prior Publication Data
US 2017/0170204 A1  Jun. 15, 2017

(30) Foreign Application Priority Data

Dec. 11, 2015  (JP) .................................. 2015-242365

(51) Int. Cl.
*H01L 27/12* (2006.01)
(52) U.S. Cl.
CPC ........ *H01L 27/127* (2013.01); *H01L 27/1225* (2013.01)
(58) Field of Classification Search
None
See application file for complete search history.

(56) References Cited

U.S. PATENT DOCUMENTS

| 2008/0035920 | A1 | 2/2008 | Takechi et al. |
| 2013/0063675 | A1* | 3/2013 | Misaki ............... H01L 29/7869 349/46 |
| 2015/0311233 | A1 | 10/2015 | Hsin et al. |

FOREIGN PATENT DOCUMENTS

| JP | H05-088191 A | 4/1993 |
| JP | H05-232496 A | 9/1993 |
| JP | H11-190858 A | 7/1999 |
| JP | 2008-040343 A | 2/2008 |
| JP | 2011-187509 A | 9/2011 |
| JP | 2015-211212 A | 11/2015 |
| WO | 2017002655 A1 | 1/2017 |

* cited by examiner

*Primary Examiner* — Eva Y Montalvo
*Assistant Examiner* — Kevin Quinto
(74) *Attorney, Agent, or Firm* — Studebaker & Brackett PC

(57) ABSTRACT

A substrate for a display device, includes: an insulation substrate; an insulation film, which is formed on the insulation substrate and is primarily made of one of silicon oxide and oxidized metal; an inorganic film, which is formed to be in direct contact with the insulation film and has an insulator part that is formed by changing oxide semiconductor into insulator; and a wiring film, which is formed to be in direct contact with the insulator part.

18 Claims, 34 Drawing Sheets

FIG.6B P

MANUFACTURING METHOD OF SUBSTRATE FOR DISPLAY DEVICE AND MANUFACTURING METHOD OF DISPLAY DEVICE

CROSS-REFERENCE TO RELATED APPLICATION

This application claims priority from Japanese Patent Application No. 2015-242365 filed on Dec. 11, 2015, the entire subject matter of which is incorporated herein by reference.

TECHNICAL FIELD

This disclosure relates to a substrate for a display device having a film formed by using oxide semiconductor, a manufacturing method thereof, the display device and a manufacturing method thereof.

BACKGROUND

In recent years, a liquid crystal display device is often used as an example of a display device. The liquid crystal display device is includes a thin film transistor (hereinafter referred to as "TFT") array substrate, in which liquid crystal layer is interposed between a pair of translucent insulation substrates. The TFT array substrate includes, on a liquid crystal layer face of one of the pair of translucent insulation substrates, a plurality of scanning wirings and a plurality of signal wirings arranged in a matrix with interposing an insulation film. TFTs are provided in the vicinity of cross points between the scanning wirings and the signal wirings, and pixel electrodes apply image signals through the signal wirings.

Supplying of the image signals to the pixel electrodes is controlled by controlling turning on/off of the TFTs, based on the scanning signals from the scanning wirings. Terminals for inputting the signals to the scanning wirings and the signal wirings are provided at the outer-side end portions of a display region of the TFT array substrate. Further, terminal wirings for coupling between the scanning wirings and the corresponding terminals, and terminals wirings for coupling between the signal wirings and the corresponding terminals are provided.

Further, the liquid crystal display device includes a color filter (hereinafter referred to as "CF") substrate as the other of the pair of translucent insulation substrates.

In the display device, while high precision and miniaturization is progressed, a demand for reducing failure in a manufacturing process is also increased. Failure of the display device is caused based on various reasons. One example of the reasons is a disconnection failure in which a wiring such as the signal wiring, the scanning wiring or the terminal wiring is partially broken due to foreign particle incorporated in the manufacturing process, for example. If the disconnection failure occurs, an electrical signal flowing through this wiring is broken, and thus a display failure such as a line-shaped image appears on a display screen.

For example, JP-A-H05-232496 discloses a technique so-called "connection repair" with respect to such the disconnection failure. According to the background art, a laser light is irradiated on two portions which sandwich the disconnection part of the wiring to partially remove the insulation film covering the wiring, and thus two contact holes each penetrating the insulation film are formed, so that a metal film is formed so as to bridge the two contact holes sandwiching the disconnection part, thereby electrically connecting the disconnection part to make this part conductive.

SUMMARY

However, according to the connection repair described above, shape of the inner wall of the contact hole becomes irregular when forming the contact hole in the insulation film. Accordingly, the coverage performance of the metal film formed as an upper layer becomes low, and sufficient electrical conductively cannot be obtained despite of the connection repair, and thus a conduction failure occurs.

This disclosure provides a substrate for a display device, a manufacturing method thereof, the display device and a manufacturing method thereof, each of which can reduce a conduction failure which occurs at a time of performing connection repair with respect to disconnection of a wiring.

The substrate for the display device and the display device according to this disclosure includes: an insulation substrate; an insulation film, which is formed on the insulation substrate and is primarily made of one of silicon oxide and oxidized metal; an inorganic film, which is formed to be in direct contact with the insulation film and has an insulator part that is formed by changing oxide semiconductor into insulator; and a wiring film, which is formed to be in direct contact with the insulator part.

The method of manufacturing the substrate for the display device and the method of manufacturing the display device according to this disclosure includes: forming, on an insulation substrate, an insulation film, which is primarily made of one of silicon oxide and oxidized metal; forming an inorganic film, which has an insulator part that is formed by changing oxide semiconductor into insulator, to be in direct contact with the insulation film; and forming a wiring film to be in direct contact with the insulator part.

According to the substrate for the display device and the display device according to this disclosure, even if disconnection occurs in the wiring film, it is possible to reduce conduction failure occurring at a time of performing connection repair.

According to the method of manufacturing the substrate for the display device and the method of manufacturing the display device according to this disclosure, even if the disconnection occurs in the wiring film, the conduction failure occurring at the time of performing the connection repair can be reduced.

BRIEF DESCRIPTION OF THE DRAWINGS

The foregoing and additional features and characteristics of this disclosure will become more apparent from the following detailed descriptions considered with the reference to the accompanying drawings, wherein:

FIGS. 6A and 6B are cross-sectional views illustrating a part of the manufacturing process of the TFT array substrate according to the first embodiment of this disclosure;

DETAILED DESCRIPTION

First Embodiment

Figure 1:
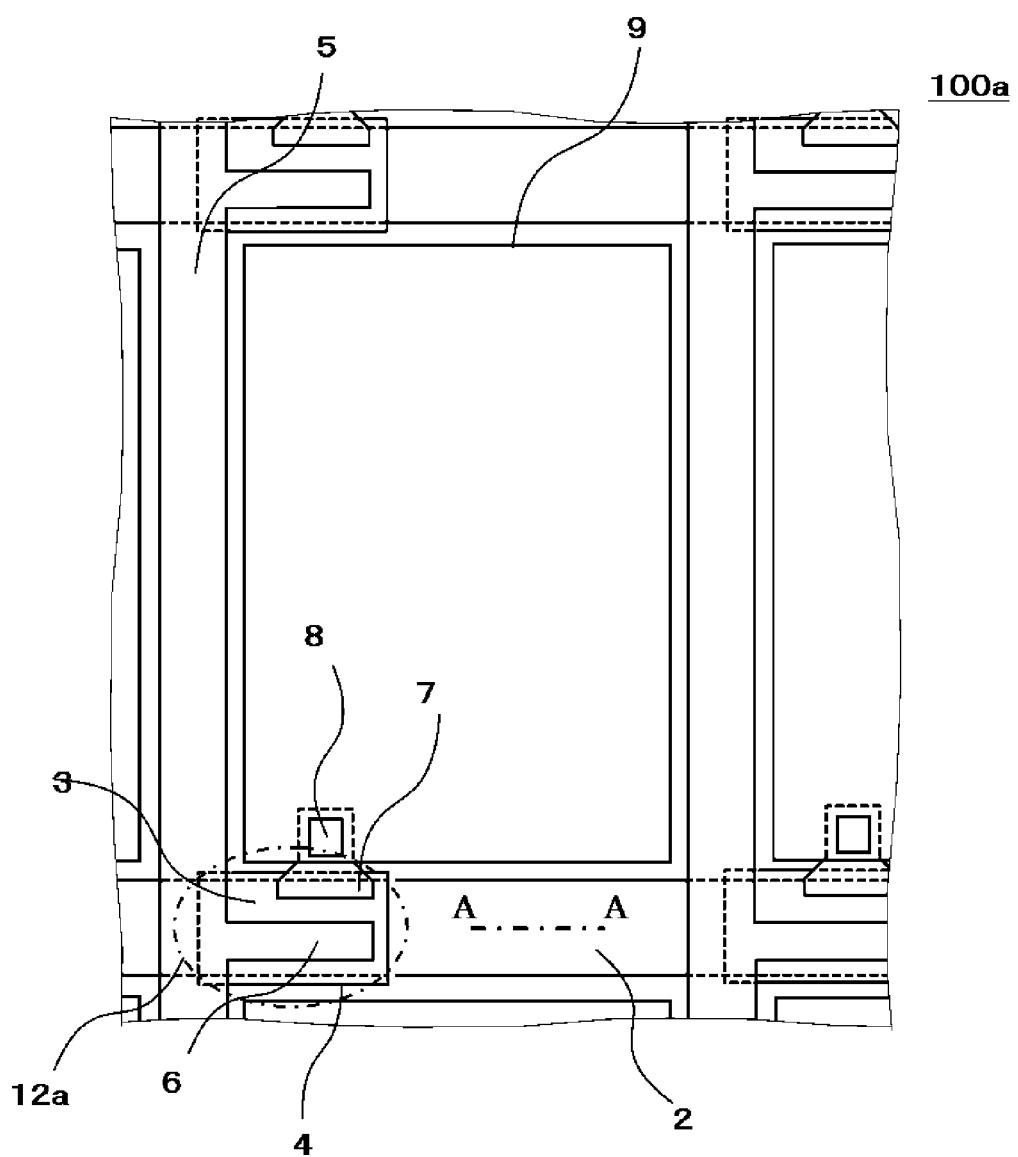
FIG. 1 is a top view illustrating a TFT array substrate according to a first embodiment of this disclosure.

Firstly, configurations of TFT array substrates 100a, 100b used as a substrate for a display device according to the first embodiment of this disclosure will be described. FIG. 1 is a top view illustrating the TFT array substrate 100a according to the first embodiment of this disclosure.

A display region of the TFT array substrate 100a of a liquid crystal display device will be described with reference to FIG. 1. In the display region, gate wiring films 2 as a plurality of scanning wirings, and thusurce wiring films 5 as a plurality of signal wirings are arranged in a matrix.

A TFT 12a having an a-Si layer 4, a gate electrode 3, a source electrode 6 and a drain electrode 7 is provided in the vicinity of a cross point of the gate wiring film 2 and the source wiring film 5. The individual display region contains a pixel electrode 9 which is supplied with an image signal from the drain electrode 7 via a contact hole 8.

Figure 2:
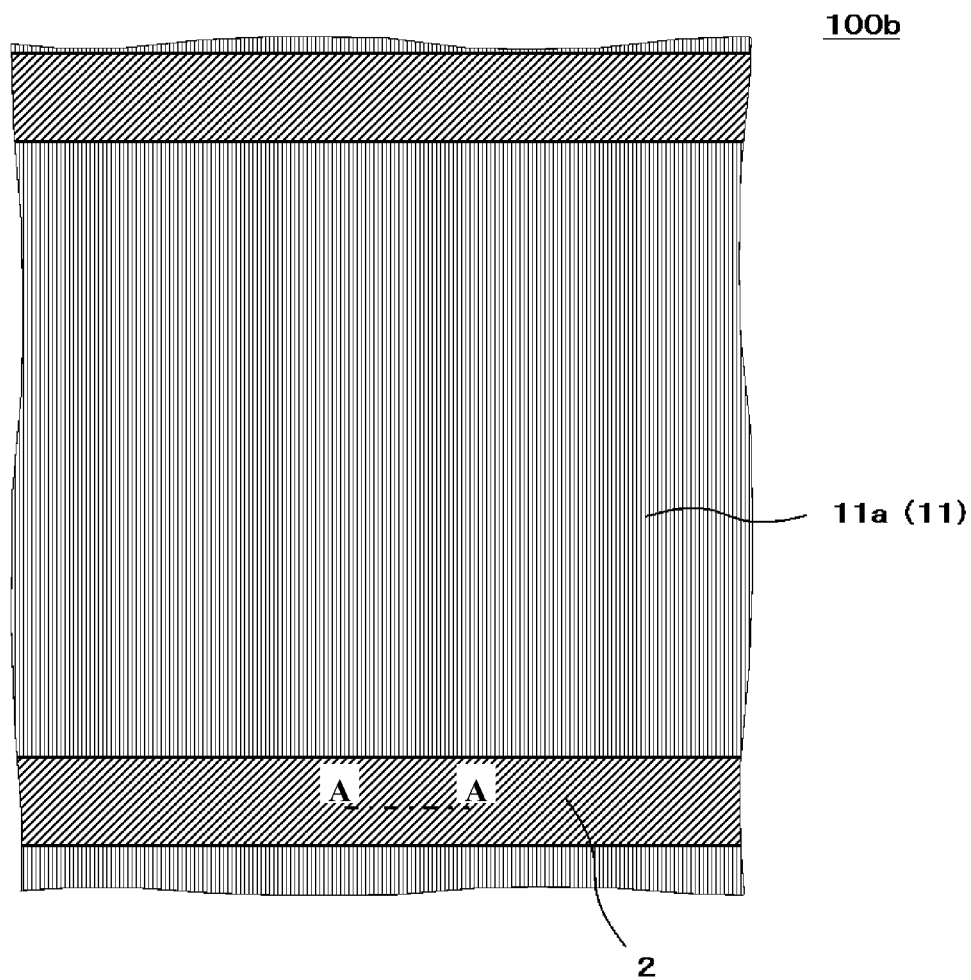
FIG. 2 is a top view illustrating a TFT array substrate according to the first embodiment of this disclosure.
Figure 3:
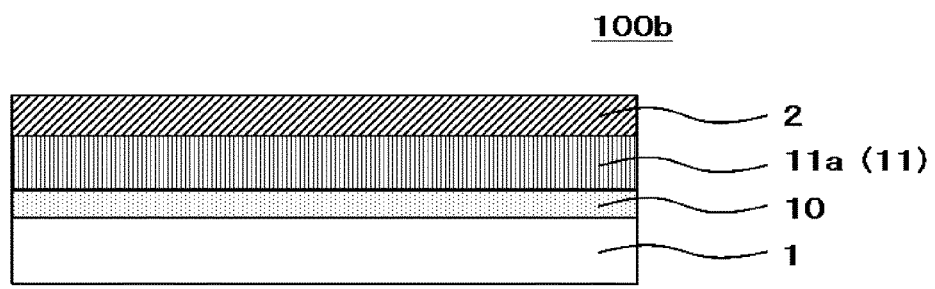
FIG. 3 is a cross-sectional view illustrating the TFT array substrate according to the first embodiment of this disclosure.

FIG. 2 is a top view illustrating the TFT array substrate 100b according to the first embodiment of this disclosure. FIG. 2 corresponds to the TFT array substrate 100a in a stage before forming the pixel electrode 9, the contact hole 8, an interlayer insulation film 14, the source electrode 6, the drain electrode 7, the source wiring film 5, the a-Si layer 4 and a gate insulation film 13. FIG. 3 is a cross-sectional view of the TFT array substrate 100b according to the first embodiment of this disclosure. FIG. 3 is the cross-sectional view taken along line A-A in parallel to a longitudinal direction of the gate wiring film 2 in FIG. 2.

In FIG. 3, an insulation film 10 is formed on a glass substrate 1 as a translucent insulation substrate. The insulation film 10 is primarily made of silicon oxide (SiOx) such as $SiO_2$.

For example, the insulation film 10 has a thickness of 1 nm to 1 μm. This film thickness is preferably 1 nm or more in a view point of forming a uniform film and obtaining a function of the insulation film. On the other hand, this film thickness is preferably 1 μm or less in a view point of productivity. More preferably, this film has the thickness of 10 nm to 500 nm.

An inorganic film 11 is formed on the insulation film 10 to be in direct contact with the insulation film 10. The inorganic film 11 is formed by an insulator part 11a which is obtained by changing oxide semiconductor into insulator. The insulator means that a specific resistance thereof is $1 \times 10^6$ Ω·cm or more. More preferably, the insulator has the specific resistance of $1 \times 10^7$ Ω·cm or more.

The inorganic film 11 is made of oxide semiconductor such as InGaZnO (indium gallium zinc oxide) under a condition to obtain property of the insulator.

For example, the inorganic film 11 has a thickness of 5 nm to 1 μm. This film thickness is preferably 5 nm or more in a view point of forming a uniform film. On the other hand, this film thickness is preferably 1 μm or less in a view point of productivity. More preferably, this film has the thickness of 10 nm to 500 nm.

The gate wiring film 2, as a wiring film for forming a gate wiring, is formed on the insulator part 11a to be in direct contact with the insulator part 11a which is obtained by changing the oxide semiconductor into the insulator.

The gate wiring film 2 is formed of metal, for example, chrome (Cr), aluminum, aluminum alloy, molybdenum, molybdenum alloy or copper.

For example, the gate wiring film 2 has a thickness of 50 nm to 1 μm. This film thickness is preferably 50 nm or more in a view point of lowering a resistance value. On the other hand, this film thickness is preferably 1 μm or less in a view point of productivity. More preferably, this film has the thickness of 100 nm to 500 nm.

Secondly, a manufacturing method of the TFT array substrates 100a, 100b according to the first embodiment of this disclosure will be described. FIGS. 4 to 8 are cross-sectional views illustrating parts of manufacturing process of the TFT array substrate 100b according to the first embodiment of this disclosure.

Figure 4:
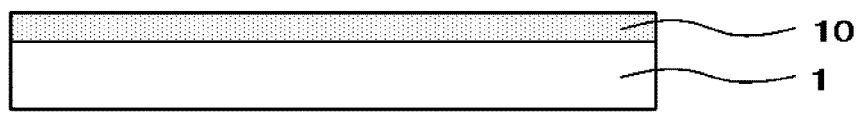
FIG. 4 is a cross-sectional view illustrating a part of manufacturing process of the TFT array substrate according to the first embodiment of this disclosure.

At first, an $SiO_2$ film is formed to have a thickness of about 50 nm on the entire surface of the glass substrate 1 as the translucent insulation substrate, by using a CVD device, whereby the insulation film 10 is formed (FIG. 4).

Figure 5:
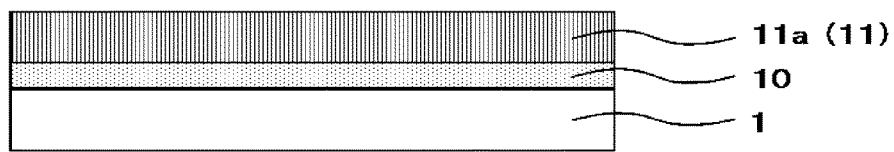
FIG. 5 is a cross-sectional view illustrating a part of the manufacturing process of the TFT array substrate according to the first embodiment of this disclosure.

Next, an InGaZnO film as the oxide semiconductor film is formed to have a thickness of about 80 nm on the entire surface of the insulation film 10 under a condition to obtain property of the insulator, by using a sputtering device, whereby the inorganic film 11 made of the insulator part 11a is formed (FIG. 5). Specifically, for example, this film is formed under a condition that a partial pressure of oxygen with respect to Ar (argon) is set to about 20% in the sputtering.

Figure 6A:
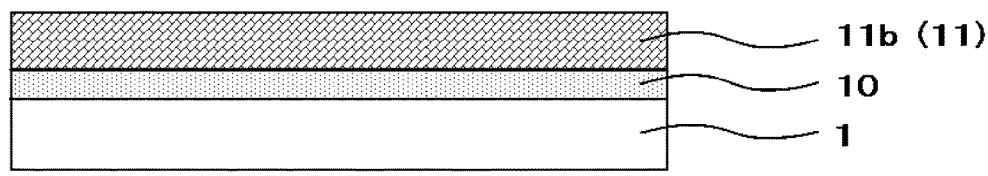
Figure 6A:
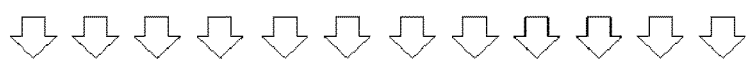
Figure 6A:
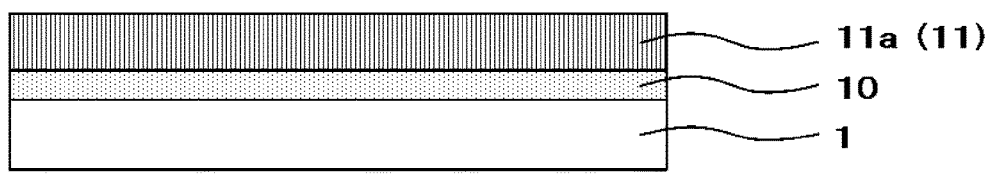

In place of forming the InGaZnO film of the oxide semiconductor under the condition to obtain the property of insulator, the InGaZnO film may be formed under a condition to obtain property of semiconductor to form a semiconductor part 11b (FIG. 6A). Then the InGaZnO may be changed into insulator, that is, changed to the insulator from the semiconductor by implementing a plasma process ($N_2O$ plasma process) P with using nitrous oxide ($N_2O$) gas, and thus the inorganic film 11 made of the insulator part 11a may be formed (FIG. 6B). The semiconductor means that a specific resistance thereof is more than $1 \times 10^{-2}$ Ω·cm and less than $1 \times 10^6$ Ω·cm. More preferably, the semiconductor has the specific resistance of $1 \times 10^2$ Ω·cm to $1 \times 10^5$ Ω·cm.

Figure 7:
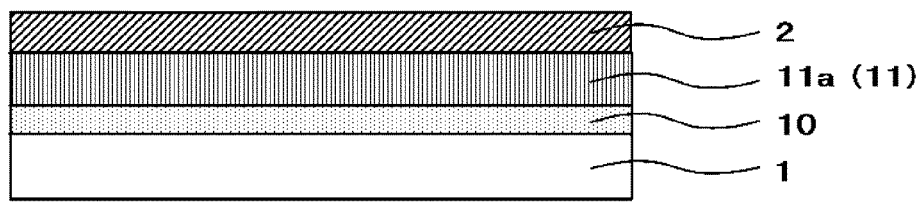
FIG. 7 is a cross-sectional view illustrating a part of the manufacturing process of the TFT array substrate according to the first embodiment of this disclosure.
Figure 8:
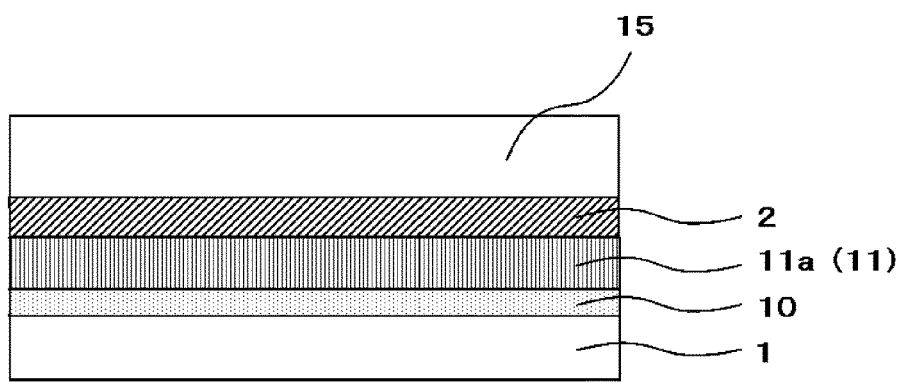
FIG. 8 is a cross-sectional view illustrating a part of the manufacturing process of the TFT array substrate according to the first embodiment of this disclosure.

Next, a chrome film is formed to have a thickness of about 200 nm by using the sputtering device, whereby the gate wiring film 2 is formed on the insulator part 11a (FIG. 7). Thereafter, a photoengraving process for forming a wiring pattern, etc. is performed on the gate wiring film 2 by using resist 15, and an etching process for removing portions of the gate wiring film 2 not covered by the resist 15 is performed (FIG. 8). Then the resist 15 is removed, and thus the TFT array substrate 100b shown in FIGS. 2 and 3 is obtained.

Thereafter, the gate insulation film 13, the a-Si layer 4, the source wiring film 5, the source electrode 6, the drain electrode 7, the interlayer insulation film 14, the contact hole 8 and the pixel electrode 9 are formed, and thus the TFT array substrate 100a shown in FIG. 1 is obtained.

Figure 9:
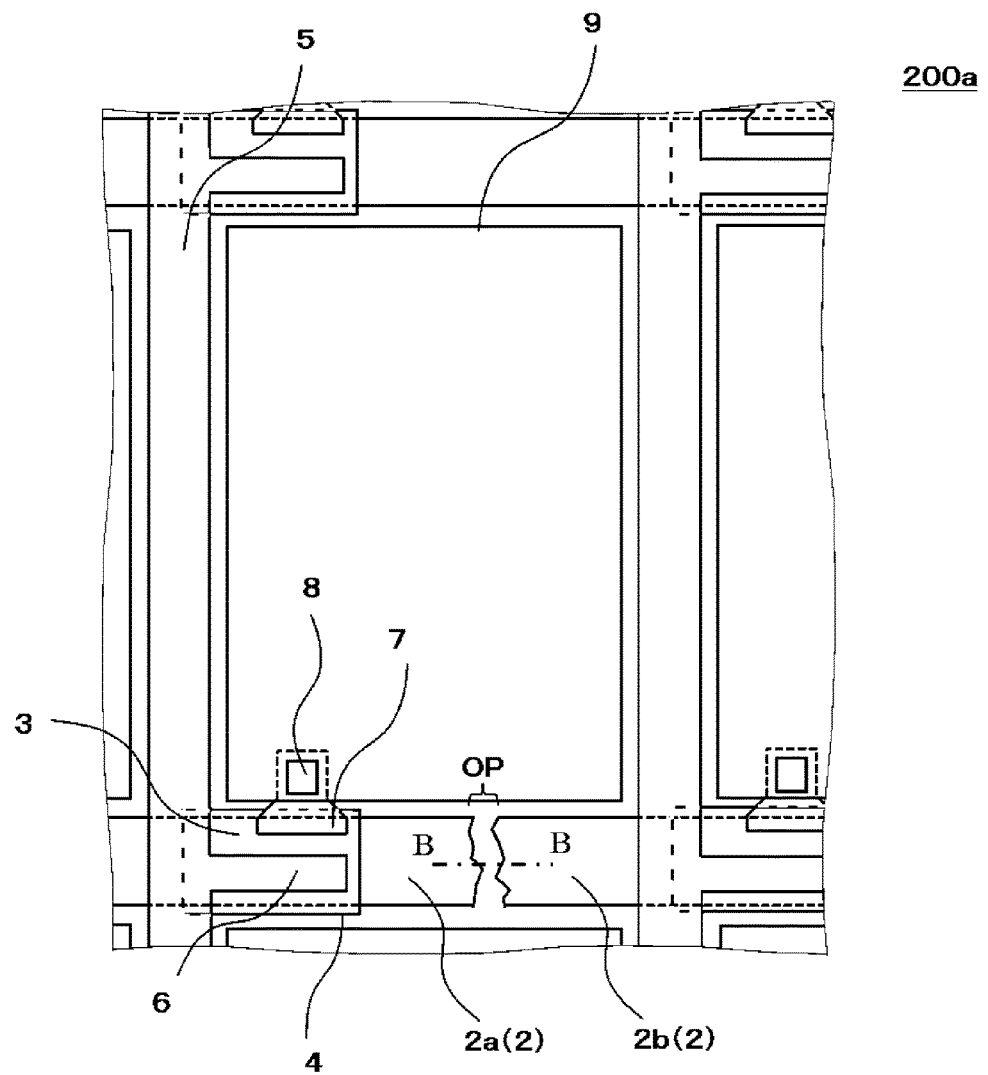
FIG. 9 is a top view illustrating a TFT array substrate according to the first embodiment of this disclosure.

Thirdly, configurations of the TFT array substrates 100a, 100b according to the first embodiment of this disclosure in a case where the gate wiring film 2 has a disconnection part OP will be described. FIG. 9 is a top view illustrating a TFT array substrate 200a according to the first embodiment of this disclosure. In FIG. 9, the TFT array substrate 200a according to the first embodiment of this disclosure has the disconnection part OP at the gate wiring film 2. The TFT array substrate 200a shown in FIG. 9 has the same configuration as the TFT array substrate shown in FIG. 1 except for that the gate wiring film 2 has the disconnection part OP.

Figure 10:
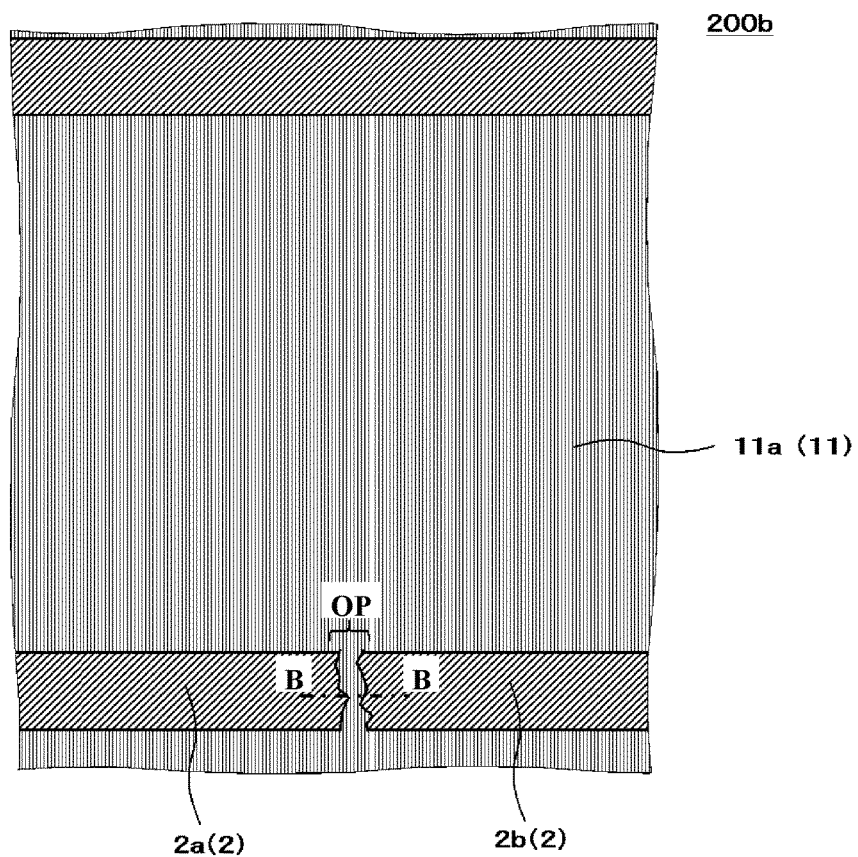
FIG. 10 is a top view illustrating a TFT array substrate according to the first embodiment of this disclosure.

FIG. 10 is a top view illustrating a TFT array substrate 200b according to the first embodiment of this disclosure. FIG. 10 corresponds to the TFT array substrate 200a of FIG. 9 in a stage before forming the pixel electrode 9, the contact hole 8, the interlayer insulation film 14, the source electrode 6, the drain electrode 7, the source wiring film 5, the a-Si layer 4 and the gate insulation film 13.

Figure 16:
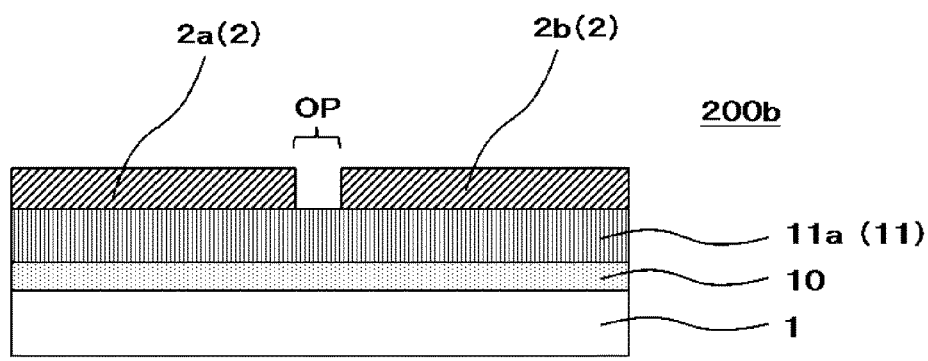
FIG. 16 is a cross-sectional view illustrating the TFT array substrate according to the first embodiment of this disclosure.

FIG. 16 is a cross-sectional view of the TFT array substrate 200b according to the first embodiment of this disclosure. FIG. 16 is the cross-sectional view taken along line B-B in parallel to a longitudinal direction of the gate wiring film 2 in FIG. 10. In the configuration of the TFT array substrate according to the first embodiment of this disclosure in the case of having the disconnection part OP, as shown in FIG. 16, the gate wiring film 2 is separated in the longitudinal direction in a manner of interposing the disconnection part OP. Thus, a first gate wiring film 2a and a second gate wiring film 2b being not in direct contact with the first gate wiring film 2a are formed. Since the remaining configuration of this TFT array substrate is the same as that in the case where the disconnection part OP is not formed as shown in FIG. 3, descriptions thereof will be omitted.

One example of mechanism of causing the disconnection part OP at the wiring will be described. If foreign particle 16 is incorporated on the surface of the substrate or the like, it arises various defects such as disconnection, short-circuit and insulation failure. Array manufacturing processes such as the photoengraving process, etc. are performed in a so-called "clean room" from which the foreign particle 16 is removed as much as possible.

Figure 14:
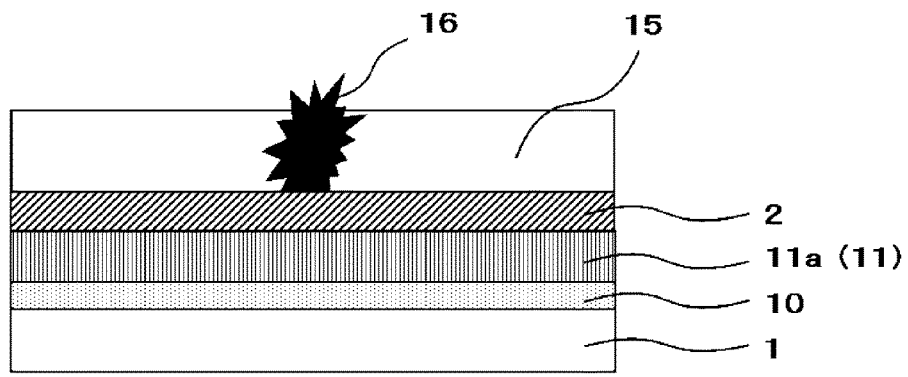
FIG. 14 is a cross-sectional view illustrating a part of manufacturing process of the TFT array substrate according to the first embodiment of this disclosure.
Figure 15:
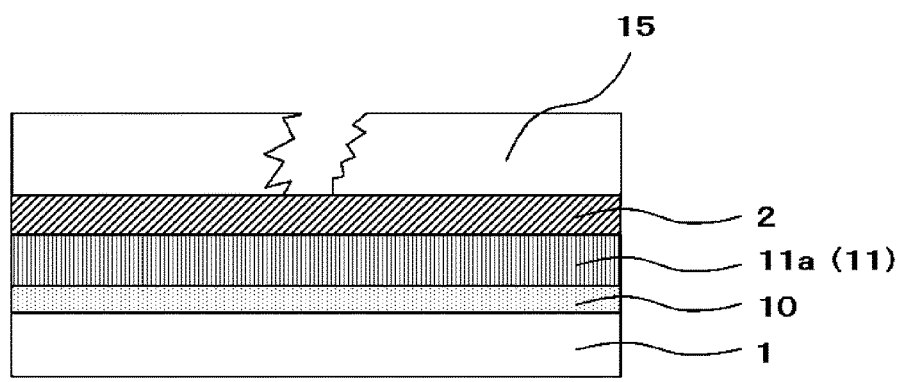
FIG. 15 is a cross-sectional view illustrating a part of the manufacturing process of the TFT array substrate according to the first embodiment of this disclosure.

However, for example, the fine foreign particle 16 generated from a manufacturing device is sometimes incorporated on the surface of the substrate or the like. FIGS. 14 and 15 are cross-sectional views illustrating parts of the manufacturing process of the TFT array substrate 200b according to the first embodiment of this disclosure. FIG. 14 illustrates a case where the foreign particle 16 is incorporated into the resist 15 in the photoengraving process shown in FIG. 8. FIG. 15 is the cross-sectional view illustrating a state where the foreign particle 16 of FIG. 14 is peeled off.

As shown in FIG. 15, if the foreign particle 16 peels off, for example, in a resist developing step or a cleaning step before the etching step, an unintentional portion not covered by the resist 15 appears in the gate wiring film. As shown in FIG. 16, at this portion not covered by the resist 15, the gate wiring film 2 is etched away and the disconnection part OP appears. Even if the foreign particle 16 does not peel, etchant often enters into a boundary face between the gate wiring film 2 and the resist 15 and also a boundary face between the gate wiring film and the foreign particle 16, and thus a similar disconnection part OP is often generated.

Fourthly, configurations of the TFT array substrate according to the first embodiment of this disclosure which is subjected to connection repair in a case where the disconnection part OP is generated at the gate wiring film 2 will be descried.

Figure 11:
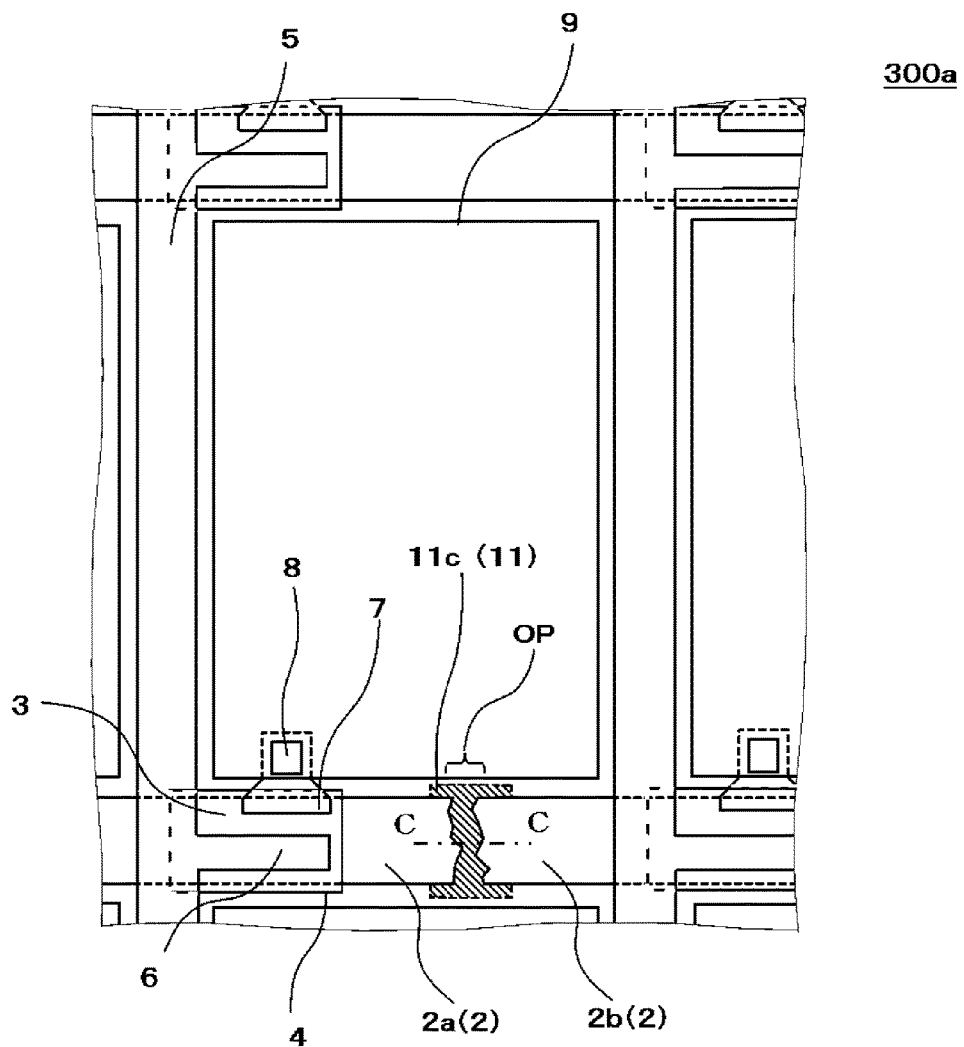
FIG. 11 is a top view illustrating a TFT array substrate according to the first embodiment of this disclosure.
Figure 12:
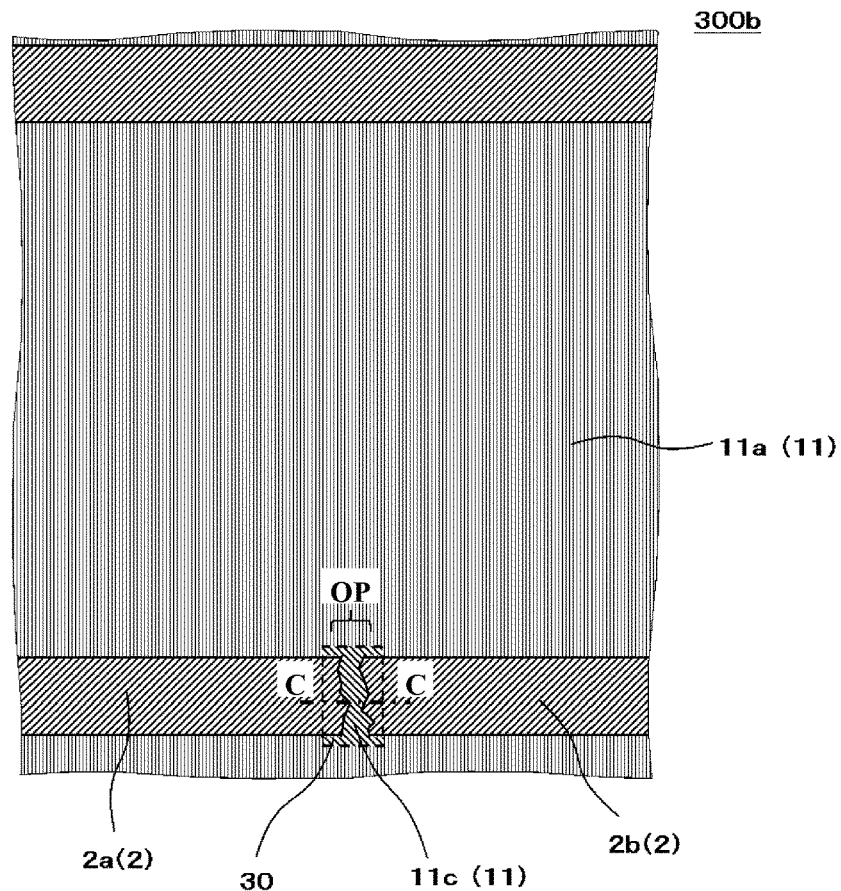
FIG. 12 is a top view illustrating a TFT array substrate according to the first embodiment of this disclosure.

FIG. 11 is a top view illustrating a TFT array substrate 300a according to the first embodiment of this disclosure. FIG. 12 is a top view illustrating a TFT array substrate 300b according to the first embodiment of this disclosure.

FIG. 11 corresponds to a state where a conductor part 11c, which is formed by changing the oxide semiconductor film into conductor, is formed at the disconnection part OP of the gate wiring film 2 in FIG. 9. FIG. 12 corresponds to a state where the conductor part 11c, which is formed by changing the oxide semiconductor film into the conductor, is formed at the disconnection part OP of the gate wiring film 2 in FIG. 10.

Figure 13:
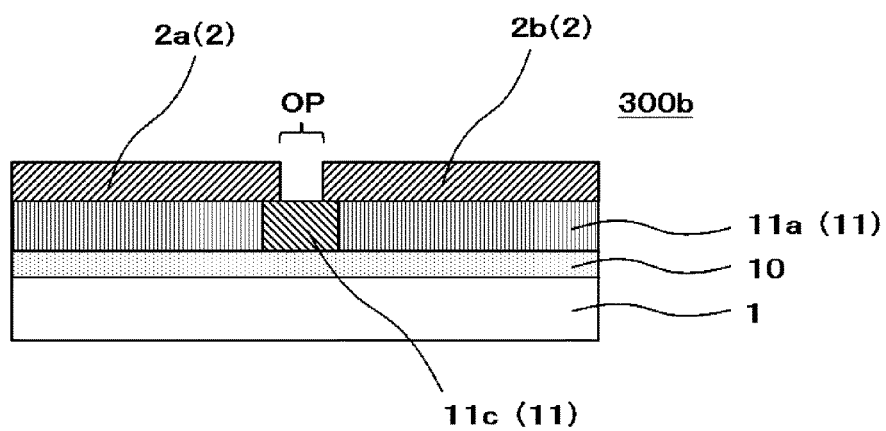
FIG. 13 is a cross-sectional view illustrating the TFT array substrate according to the first embodiment of this disclosure.

FIG. 13 is a cross-sectional view of the TFT array substrate 300b according to the first embodiment of this disclosure. FIG. 13 is the cross-sectional view taken along line C-C in parallel to a longitudinal direction of the gate wiring film 2 in FIG. 12. In FIG. 13, the inorganic film 11 has the conductor part 11c formed by changing the oxide semiconductor into the conductor, and the conductor part 11c is in direct contact with both the first gate wiring film 2a and the second gate wiring film 2b. Since the remaining configuration of this TFT array substrate is the same as that of the TFT array substrate shown in FIG. 16, descriptions thereof will be omitted.

Figure 17:
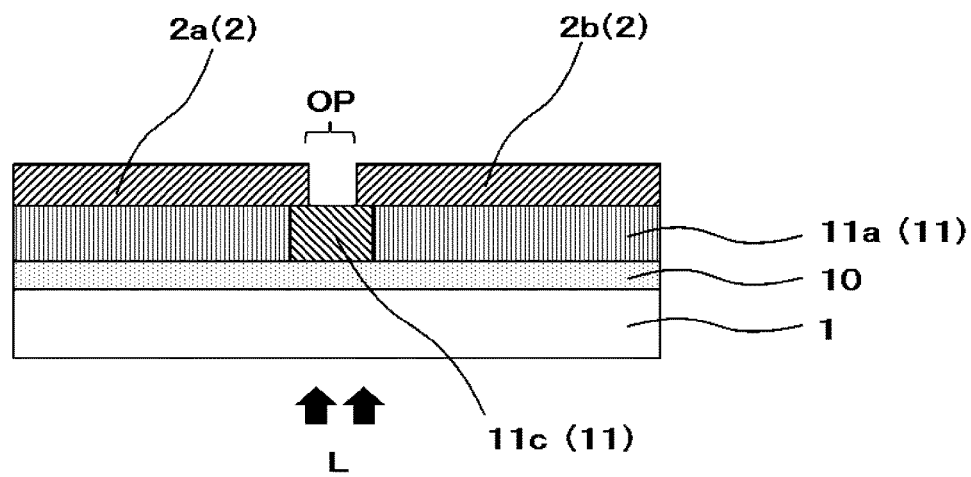
FIG. 17 is a cross-sectional view illustrating a part of the manufacturing process of the TFT array substrate according to the first embodiment of this disclosure.

Fifthly, a method of manufacturing the TFT array substrate 300b by subjecting the TFT array substrate 200b according to the first embodiment of this disclosure to the connection repair will be described. FIG. 17 is a cross-sectional view illustrating a part of the manufacturing process of the TFT array substrate 300b according to the first embodiment of this disclosure. FIG. 17 illustrates a process of irradiating the disconnection part OP with ultraviolet rays L.

At first, the disconnection part OP is detected by a defect inspection apparatus or the like and the ultraviolet rays L are irradiated on the disconnection part OP by using an ultraviolet laser. As shown in FIG. 17, the ultraviolet rays L are irradiated in a direction toward the inorganic film 11 from the glass substrate 1, that is, toward the disconnection part OP from the rear surface side of the glass substrate 1. The ultraviolet rays L transmit the glass substrate 1 and are irradiated on the insulation film 10 and the insulator part 11a of the inorganic film 11.

Figure 18:
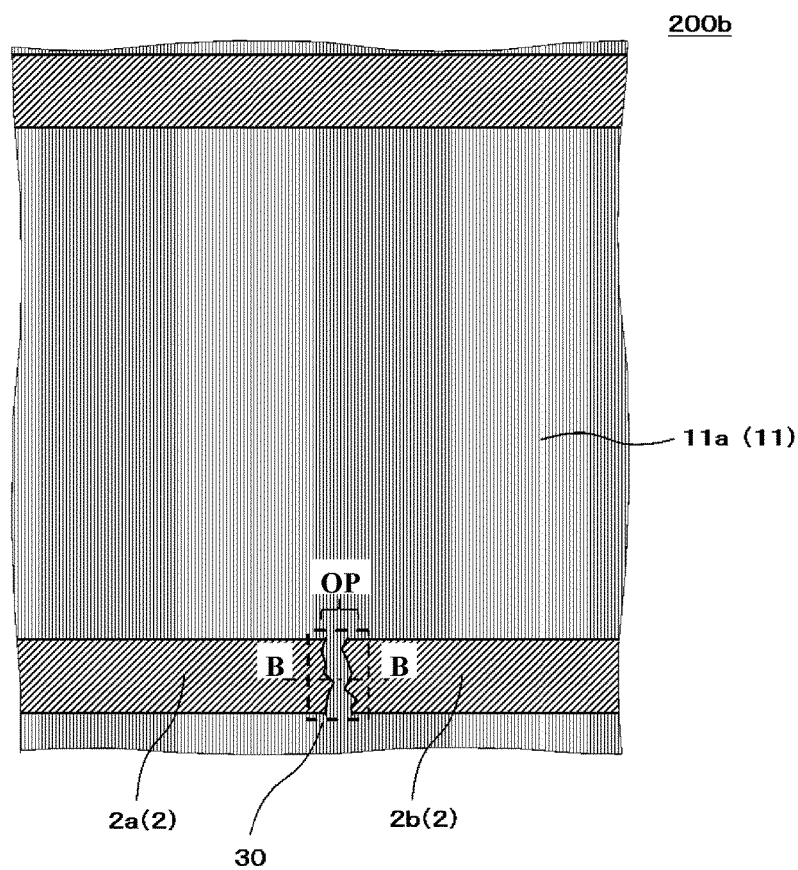
FIG. 18 is a top view illustrating the TFT array substrate according to the first embodiment of this disclosure.

FIG. 18 is a top view illustrating the TFT array substrate 200b according to the first embodiment of this disclosure. FIG. 18 illustrates a range 30 on which the ultraviolet rays L are irradiated, at a time of manufacturing the TFT array substrate 300b by subjecting the TFT array substrate 200b according to the first embodiment of this disclosure to the connection repair. The range 30 on which the ultraviolet rays L are irradiated is, for example, a range surrounding the disconnection part OP as shown in FIG. 18.

When the ultraviolet rays L are irradiated on a portion where the insulator part 11a, which is formed by changing the oxide semiconductor film into the insulator, is in direct contact with the insulation film 10 made of the silicon oxide ($SiO_2$) film, electronic carriers of the oxide semiconductor film are effectively excited, and thus a specific resistance value of the oxide semiconductor film reduces. Therefore, the insulator part 11a is changed into the conductor, whereby the conductor part 11c is formed. Since the conductor part 11c formed by changing the oxide semiconductor into the conductor is in direct contact with both the first gate wiring film 2a and the second gate wiring film 2b, the first gate wiring film 2a and the second gate wiring film 2b are electrically conducted to each other via the oxide semiconductor film that is changed into the conductor. As the connection repair is performed in this manner, the oxide semiconductor film that is changed into the conductor directly fits to the first gate wiring film 2a and the second gate wiring film 2b. Thus, conduction failure can be reduced as compared with the conventional state (see FIGS. 12 and 13). The conductor means that a specific resistance thereof is $1 \times 10^{-2}$ Ω·cm or less. More preferably, the conductor has the specific resistance of $1 \times 10^{-3}$ Ω·cm or less.

By performing the connection repair in this manner, the TFT array substrate 300b shown in FIGS. 12 and 13 is obtained. Thereafter, the gate insulation film 13, the a-Si layer 4, the source wiring film 5, the source electrode 6, the drain electrode 7, the interlayer insulation film 14, the contact hole 8 and the pixel electrode 9 are formed, and thus the TFT array substrate 300a shown in FIG. 11 is obtained.

Figure 19:
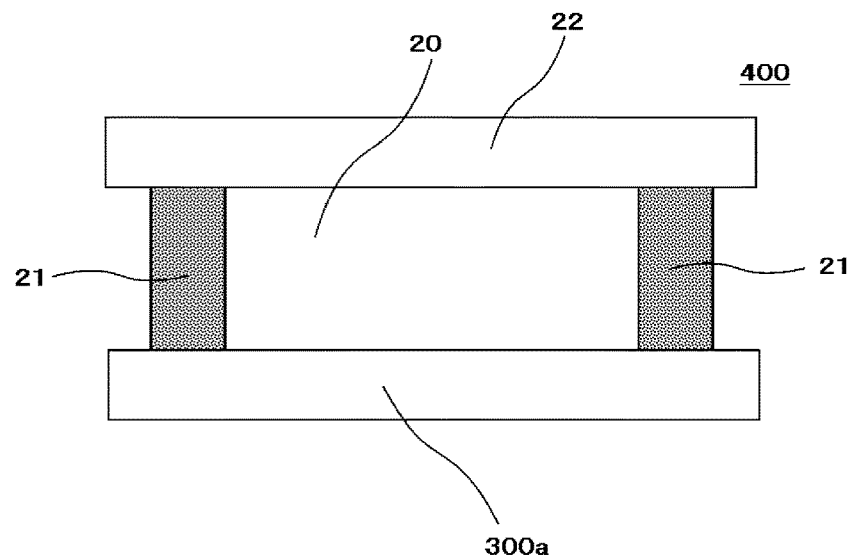
FIG. 19 is a cross-sectional view illustrating a liquid crystal display device according to the first embodiment of this disclosure.

FIG. 19 is a cross-sectional view illustrating a liquid crystal display device 400 according to the first embodiment of this disclosure. After forming an oriented film, etc., as shown in FIG. 19, a CF substrate 22 is laminated on the TFT array substrate 300a via a seal member 21, and liquid crystal 20 is filled in a region surrounded by the TFT array substrate 300a, the CF substrate 22 and the seal member 21, whereby the liquid crystal display device 400 as the display device is formed.

The TFT array substrate and the liquid crystal display device according to the first embodiment of this disclosure includes: the insulation glass substrate 1; the insulation film 10 formed on the glass substrate 1 and is primarily made of silicon oxide; the inorganic film 11 formed to be in direct contact with the insulation film 10 and having the insulator part 11a which is formed by changing the oxide semiconductor into the insulator; and the gate wiring film 2 formed to be in direct contact with the insulator part 11a. Therefore, even if disconnection occurs in the gate wiring film 2, the conduction failure occurring at the time of performing the connection repair can be reduced.

The TFT array substrate and the liquid crystal display device according to the first embodiment of this disclosure includes the insulator part 11a formed on the insulation film 10a to be in direct contact with the insulation film 10 and the gate wiring film 2 formed on the insulator part 11a to be in direct contact with the insulator part 11a. Therefore, even if disconnection occurs in the gate wiring film 2, the conduction failure occurring at the time of performing the connection repair can be reduced.

In the TFT array substrate and the liquid crystal display device according to the first embodiment of this disclosure, the gate wiring film 2 includes the first gate wiring film 2a and the second gate wiring film 2b being not in direct contact with the first gate wiring film 2a. Further, the inorganic film 11 has the conductor part 11c formed by changing the oxide semiconductor into the conductor, and the conductor part 11c is in direct contact with both the first gate wiring film 2a and the second gate wiring film 2b. Therefore, the conduction failure occurring at the time of performing the connection repair can be reduced.

The manufacturing method of the TFT array substrate and the manufacturing method of the liquid crystal display device according to the first embodiment of this disclosure includes: the step of forming the insulation film 10 primarily made of silicon oxide on the insulation glass substrate 1; the step of forming, to be in direct contact with the insulation film 10, the inorganic film 11 having the insulator part 11a which is formed by changing the oxide semiconductor into the insulator; and the step of forming the gate wiring film 2 to be in direct contact with the inorganic film 11. Therefore, even if disconnection occurs in the gate wiring film 2, the conduction failure occurring at the time of performing the connection repair can be reduced.

The manufacturing method of the TFT array substrate and the manufacturing method of the liquid crystal display device according to the first embodiment of this disclosure, the step of forming the inorganic film 11 is performed after the step of forming the insulation film 10, and the step of forming the gate wiring film 2 is performed after the step of forming the inorganic film 11. Therefore, even if disconnection occurs in the gate wiring film 2, the conduction failure occurring at the time of performing the connection repair can be reduced.

In the manufacturing method of the TFT array substrate and the manufacturing method of the liquid crystal display device according to the first embodiment of this disclosure, the step of forming the inorganic film 11 includes the step of forming the oxide semiconductor film, and the step of forming the insulator part 11a by changing the oxide semiconductor film into the insulator after the step of forming the oxide semiconductor film. Therefore, even if disconnection occurs in the gate wiring film 2, the conduction failure occurring at the time of performing the connection repair can be reduced.

In the manufacturing method of the TFT array substrate and the manufacturing method of the liquid crystal display device according to the first embodiment of this disclosure, the step of forming the gate wiring film 2 includes the step of forming the gate wiring film 2, which includes the first gate wiring film 2a and the second gate wiring film 2b being not in direct contact with the first gate wiring film 2a, and forming the conductor part 11c which is formed by changing the oxide semiconductor into the conductor and directly in contact with both the first gate wiring film 2a and the second gate wiring film 2b. Thus, the conduction failure occurring at the time of performing the connection repair can be reduced.

In the manufacturing method of the TFT array substrate and the manufacturing method of the liquid crystal display device according to the first embodiment of this disclosure, the step of forming the conductor part 11c includes the step of forming the conductor part 11c by irradiating both the insulation film 10 and the inorganic film 11 with the ultraviolet rays L. Thus, the conduction failure occurring at the time of performing the connection repair can be reduced.

Although the first embodiment according to this disclosure employs the oxide semiconductor formed of InGaZnO as an example of the oxide semiconductor, the oxide semiconductor is not limited thereto. For example, the oxide semiconductor film such as InZnO-based, InGaO-based, InSnO-based, InSnZnO-based, InGaZnSnO-based, InAl-ZnO-based, InHf (hafnium) ZnO-based, InZr (zirconium) ZnO-based, InMg (magnesium) ZnO-based or InY (yttrium) ZnO-based oxide semiconductor film may be used. Even when such the oxide semiconductor material is used, effects similar to the case of using the InGaZnO-based oxide semiconductor film in the first embodiment according to this disclosure can be achieved.

Although the first embodiment according to this disclosure employs the silicon oxide ($SiO_2$) as an example of the insulation film 10, in place thereof, an insulation film primarily made of oxidized metal such as oxidized aluminum, oxidized titanium, oxidized zirconium, hafnium oxide, tantalum oxide or tungsten oxide may be used. In this case, effects similar to the case of using the silicon oxide in the first embodiment according to this disclosure can be achieved.

Although the first embodiment according to this disclosure employs the ultraviolet laser in the step of irradiating with the ultraviolet rays L, in place thereof, an ultraviolet lamp such as a low-pressure mercury lamp, a high-pressure mercury lamp or an ultrahigh-pressure mercury lamp or an ultraviolet LED may be used. In this case, effects similar to the effects of the first embodiment according to this disclosure can be achieved. For example, the ultraviolet lamp or the ultraviolet LED is only required to emit the ultraviolet rays of 480 nm or less.

The first embodiment according to this disclosure illustrates the case that, in the step of irradiating with the ultraviolet rays L shown in FIG. 12, the ultraviolet rays L are irradiated in the direction toward the inorganic film 11 from the glass substrate 1, that is, toward the disconnection part OP from the rear surface side of the glass substrate 1. In contrast, the ultraviolet rays may be irradiated in a direction toward the glass substrate 1 from the inorganic film 11, that is, toward the disconnection part OP from the upper surface side of the glass substrate 1. In this case, effects similar to the effects of the first embodiment according to this disclosure can be achieved.

The first embodiment according to this disclosure illustrates the case that the $N_2O$ plasma process P is performed in the step of forming the insulator part 11a by changing the oxide semiconductor film into the insulator. However, this disclosure is not limited thereto but another process may be performed so long as at least gas containing $N_2O$ is used. In this case, effects similar to the effects of the first embodiment according to this disclosure can be achieved.

Although the first embodiment according to this disclosure employs the glass substrate 1 as an example of the insulation substrate, in place thereof, a resin substrate formed of plastics or the like may be used. In this case, effects similar to the effects of the first embodiment according to this disclosure can be achieved. In particular, material having a high transmissivity in a wavelength range of the ultraviolet rays is more preferable because such the material can change the insulator part 11a made of the oxide semiconductor into the conductor with a high efficiency when the ultraviolet rays L are irradiated.

Although the first embodiment according to this disclosure illustrates the case where the disconnection occurs at the gate wiring film 2 as the wiring film, effects similar to the effects of the first embodiment according to this disclosure can also be achieved in a case where the disconnection occurs at the gate terminal, the gate electrode 3 or the gate terminal wiring. Further, effects similar to the effects of the first embodiment according to this disclosure can be achieved also in a case where the disconnection occurs at the source wiring film 5, the source terminal, the source terminal wiring, the source electrode 6 or the drain electrode 7, or in a case where the disconnection occurs at an upper electrode or a lower electrode of an in-plane switching type or an FFS (Fringe Field Switching) type liquid crystal display device as a liquid crystal display device of a transverse electric filed type, for example.

The first embodiment according to this disclosure illustrates the case of applying the invention to the liquid crystal device of transmissive structure. However, effects similar to the effects of the first embodiment according to this disclosure can also be achieved in a case of applying the invention to a display device such as a reflection type, a semi-transmissive type or a field sequential type, or in a case of applying the invention to a display device such as a polysilicon TFT type or a low-temperature polysilicon TFT type.

Although the first embodiment according to this disclosure illustrates the case of applying the invention to the liquid crystal device, effects similar to the effects of the first embodiment according to this disclosure can also be achieved in a case of applying the invention to an electronic device having electric wirings such as a touch panel or an X-ray photodetector.

Second Embodiment

A TFT array substrate according to the second embodiment of this disclosure differs from the first embodiment according to this disclosure in an order of laminating the insulation film 10, the gate wiring film 2 and the inorganic film 11.

Figure 20:
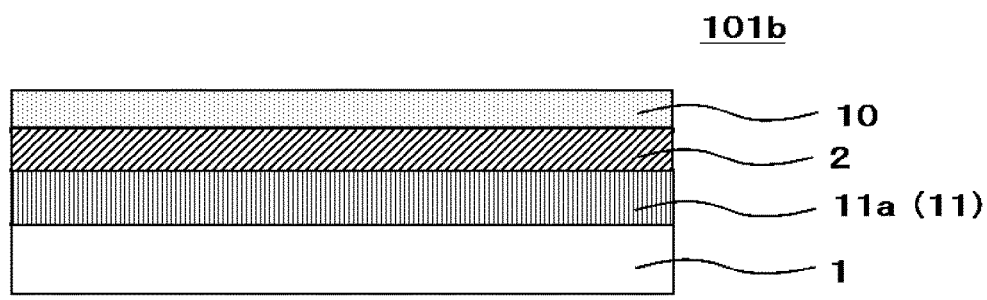
FIG. 20 is a cross-sectional view illustrating a TFT array substrate according to a second embodiment of this disclosure.

Configuration of a TFT array substrate 101b according to the second embodiment of this disclosure will be described. FIG. 20 is a cross-sectional view of the TFT array substrate 101b according to the second embodiment of this disclosure. In FIG. 20, portions identical or corresponding to those of FIG. 3 are referred to by the common symbols, and descriptions thereof will be omitted.

In FIG. 20, the inorganic film 11 made of the insulator part 11a, which is formed by changing the oxide semiconductor into the insulator, is formed on the glass substrate 1 as the translucent insulation substrate. The gate wiring film 2 is formed on the insulator part 11a to be in direct contact with the insulator part 11a which is obtained by changing the oxide semiconductor into the insulator. The insulation film 10 is formed on the gate wiring film 2 to be in direct contact with the gate wiring film 2.

Thereafter, the gate insulation film 13, the a-Si layer 4, the source wiring film 5, the source electrode 6, the drain electrode 7, the interlayer insulation film 14, the contact hole 8 and the pixel electrode 9 are formed, and thus the TFT array substrate 100a according to the second embodiment of this disclosure is obtained.

Next, a manufacturing method of the TFT array substrate 101b according to the second embodiment of this disclosure will be described. At first, the inorganic film 11 having the insulator part 11a, which is formed by changing the oxide semiconductor into the insulator, is formed on the glass substrate 1. After forming the inorganic film 11, the gate wiring film 2 is formed to be in direct contact with the inorganic film 11. After forming the gate wiring film 2, the insulation film 10 primarily made of silicon oxide is formed on the gate wiring film 2 to be in direct contact with.

Figure 25:
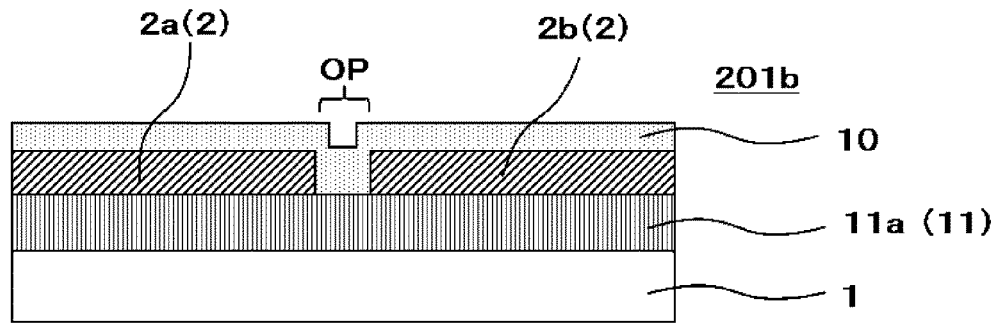
FIG. 25 is a cross-sectional view illustrating the TFT array substrate according to the second embodiment of this disclosure.

Explanation will be made as to the configuration of the TFT array substrate according to the second embodiment of this disclosure in a case where the gate wiring film 2 has a disconnection part OP. FIG. 25 is a cross-sectional view illustrating a TFT array substrate 201b according to the second embodiment of this disclosure. In the configuration of the TFT array substrate according to the second embodiment of this disclosure in the case of having the disconnection part OP, as shown in FIG. 25, the gate wiring film 2 is separated in the longitudinal direction in a manner of interposing the disconnection part OP. Thus, the first gate wiring film 2a and the second gate wiring film 2b being not in direct contact with the first gate wiring film 2a are formed. Since the remaining configuration of this TFT array substrate is the same as that in the case where the disconnection part OP is not formed as shown in FIG. 20, descriptions thereof will be omitted.

Explanation will be made as to an example of mechanism that the disconnection part OP occurs at the wiring, in the second embodiment according to this disclosure.

Figure 22:
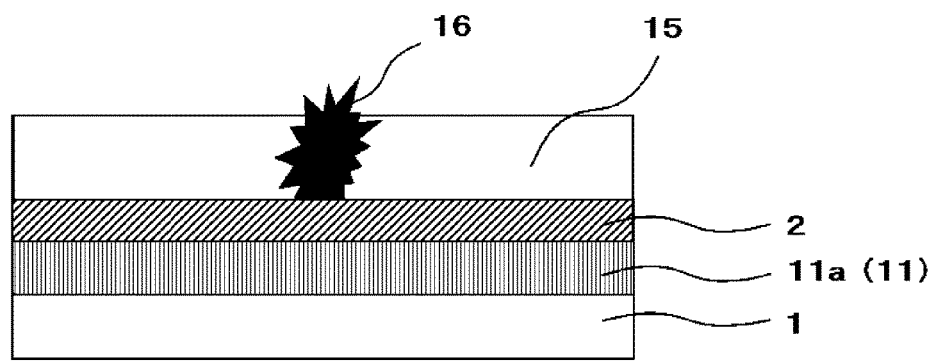
FIG. 22 is a cross-sectional view illustrating a part of manufacturing process of the TFT array substrate according to the second embodiment of this disclosure.
Figure 23:
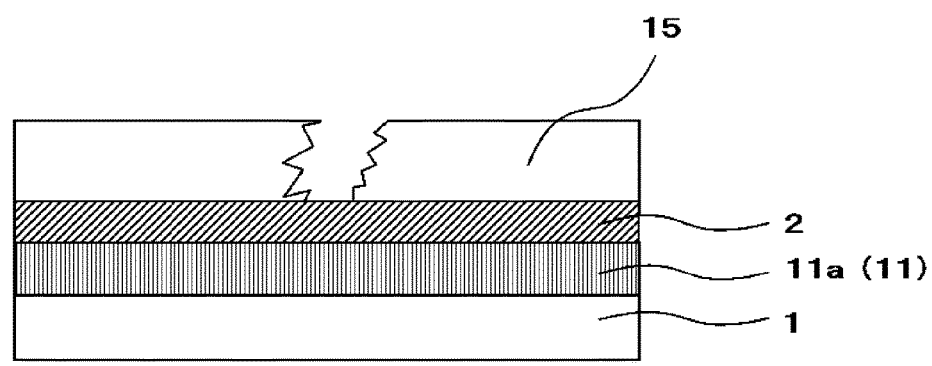
FIG. 23 is a cross-sectional view illustrating a part of the manufacturing process of the TFT array substrate according to the second embodiment of this disclosure.
Figure 24:
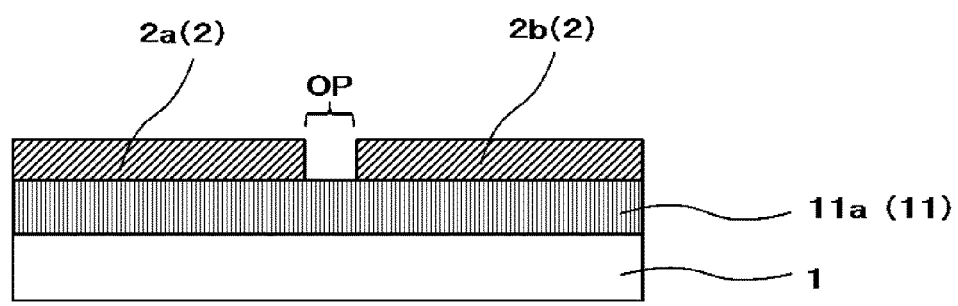
FIG. 24 is a cross-sectional view illustrating a part of the manufacturing process of the TFT array substrate according to the second embodiment of this disclosure.

FIGS. 22 to 24 are cross-sectional views illustrating parts of manufacturing process of the TFT array substrate 201b according to the second embodiment of this disclosure. FIG. 22 illustrates a case where foreign particle 16 is incorporated into the resist 15 in the photoengraving process. FIG. 23 is the cross-sectional view illustrating a state where the foreign particle 16 of FIG. 22 peels.

As shown in FIG. 23, if the foreign particle 16 peels off, an unintentional portion not covered by the resist 15 appears in the gate wiring film. As shown in FIG. 24, at this portion not covered by the resist 15, the gate wiring film 2 is etched away in the etching step and the disconnection part OP appears.

Next, explanation will be made as to configuration of the TFT array substrate according to the second embodiment of this disclosure which is subjected to connection repair in a case where the disconnection part OP is generated at the gate wiring film 2.

Figure 21:
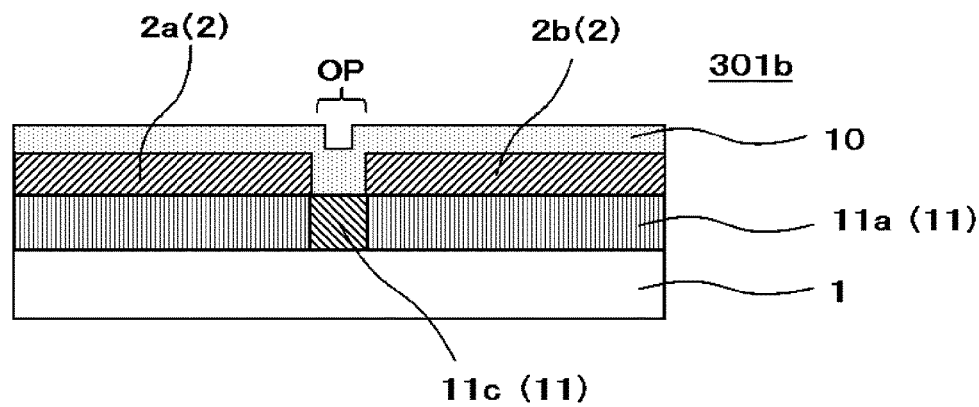
FIG. 21 is a cross-sectional view illustrating a TFT array substrate according to the second embodiment of this disclosure.

FIG. 21 is a cross-sectional view illustrating a TFT array substrate 301b according to the second embodiment of this disclosure. FIG. 25 illustrates a state where the conductor part 11c, which is formed by changing the oxide semiconductor film into the conductor, is formed at the disconnection part OP of the gate wiring film 2 in FIG. 25.

In addition to the configuration explained with reference to FIG. 25, as shown in FIG. 21, the inorganic film 11 has the conductor part 11c formed by changing the oxide semiconductor into the conductor, and the conductor part 11c is in direct contact with both the first gate wiring film 2a and the second gate wiring film 2b. Since the remaining configuration of this TFT array substrate is the same as that of the TFT array substrate in the state before forming the conductor part 11c, which is obtained by changing the oxide semiconductor film into the conductor, shown in FIG. 25, descriptions thereof will be omitted.

Figure 26:
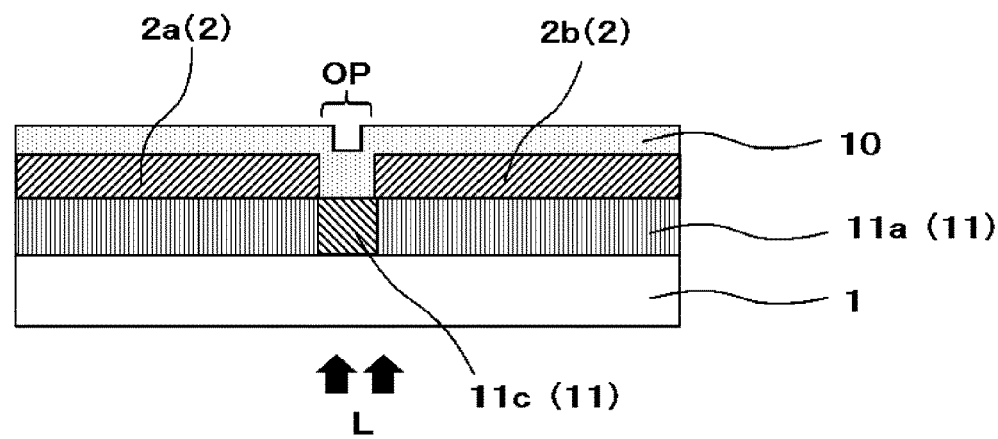
FIG. 26 is a cross-sectional view illustrating a part of the manufacturing process of the TFT array substrate according to the second embodiment of this disclosure.

Next, method of manufacturing the TFT array substrate 301b by subjecting the TFT array substrate 201b according to the second embodiment of this disclosure to the connection repair will be described. FIG. 26 is a cross-sectional view illustrating a part of the manufacturing process of the TFT array substrate 301b according to the second embodiment of this disclosure. FIG. 26 illustrates the step of irradiating the disconnection part OP with ultraviolet rays L.

The ultraviolet rays L are irradiated on the disconnection part OP, by using the ultraviolet laser. As shown in FIG. 26, the ultraviolet rays L are irradiated in a direction toward the inorganic film 11 from the glass substrate 1, that is, toward the disconnection part OP from the rear surface side of the glass substrate 1. The ultraviolet rays L transmit the glass substrate 1 and are irradiated on the insulation film 10 and the insulator part 11a of the inorganic film 11.

When the ultraviolet rays L are irradiated on a portion where the insulator part 11a, which is formed by changing the oxide semiconductor film into the insulator, is in direct contact with the insulation film 10 made of the silicon oxide ($SiO_2$) film, electronic carriers of the oxide semiconductor film are effectively excited, and thus a specific resistance value of the oxide semiconductor film reduces. Thus, the insulator part 11a is changed into the conductor, whereby the conductor part 11c is formed. Since the conductor part 11c formed by changing the oxide semiconductor into the conductor is in direct contact with both the first gate wiring film 2a and the second gate wiring film 2b, the first gate wiring film 2a and the second gate wiring film 2b are electrically conducted to each other via the oxide semiconductor film that is changed into the conductor. As the connection repair is performed in this manner, the oxide semiconductor film that is changed into the conductor directly fits to the first gate wiring film 2a and the second gate wiring film 2b. Thus, conduction failure can be reduced as compared with the conventional art (see FIG. 21).

By performing the connection repair in this manner, the TFT array substrate 301b shown in FIG. 21 is obtained. Thereafter, the gate insulation film 13, the a-Si layer 4, the source wiring film 5, the source electrode 6, the drain electrode 7, the interlayer insulation film 14, the contact hole 8 and the pixel electrode 9 are formed, and thus the TFT array substrate 301a is obtained.

After forming the oriented film, etc., the CF substrate 22 is laminated on the TFT array substrate 301a via the seal member 21, and the liquid crystal 20 is filled in a region surrounded by the TFT array substrate 301a, the CF substrate 22 and the seal member 21, whereby a liquid crystal display device 500 as the display device is formed.

The TFT array substrate and the liquid crystal display device according to the second embodiment of this disclosure includes: the insulation glass substrate 1; the inorganic film 11 formed on the insulation glass substrate 1 and having the insulator part 11a which is formed by changing the oxide semiconductor into the insulator; the gate wiring film 2 formed to be in direct contact with the insulator part 11a; and the insulation film 10 formed to be in direct contact with the gate wiring film 2 and is primarily made of one of silicon oxide and oxidized metal. Therefore, even if disconnection occurs in the gate wiring film 2, the conduction failure occurring at the time of performing the connection repair can be reduced.

The TFT array substrate and the liquid crystal display device according to the second embodiment of this disclosure includes the gate wiring film 2 formed on the insulator part 11a to be in direct contact with the insulator part 11a and the insulation film 10 formed on the gate wiring film 2 to be in direct contact with the gate wiring film 2. Therefore, even if disconnection occurs in the gate wiring film 2, the conduction failure occurring at the time of performing the connection repair can be reduced.

The manufacturing method of the TFT array substrate and the manufacturing method of the liquid crystal display device according to the second embodiment of this disclosure includes: the step of forming, on the insulation glass substrate 1, the inorganic film 11 having the insulator part 11a which is formed by changing the oxide semiconductor into the insulator; the step of forming the gate wiring film 2 to be in direct contact with the insulator part 11a; and the step of forming, on the gate wiring film 2 to be in direct contact, the insulation film 10 primarily made of one of silicon oxide and oxidized metal. Therefore, even if disconnection occurs in the gate wiring film 2, the conduction failure occurring at the time of performing the connection repair can be reduced.

In the manufacturing method of the TFT array substrate and the manufacturing method of the liquid crystal display device according to the second embodiment of this disclosure, the step of forming the gate wiring film 2 is performed after the step of forming the inorganic film 11, and the step of forming the insulation film 10 is performed after the step of forming the gate wiring film 2. Therefore, even if disconnection occurs in the gate wiring film 2, the conduction failure occurring at the time of performing the connection repair can be reduced.

Third Embodiment

A TFT array substrate according to the third embodiment of this disclosure differs from the first embodiment according to this disclosure in an order of laminating the insulation film 10, the gate wiring film 2 and the inorganic film 11.

Figure 27:
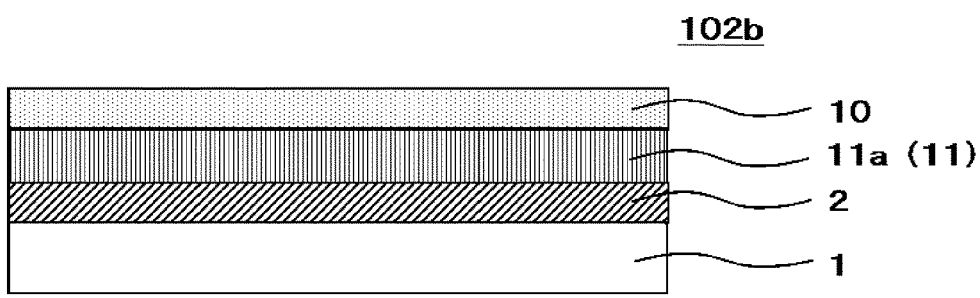
FIG. 27 is a cross-sectional view illustrating a TFT array substrate according to a third embodiment of this disclosure.

Configuration of a TFT array substrate 102b according to the third embodiment of this disclosure will be described. FIG. 27 is a cross-sectional view of the TFT array substrate 102b according to the third embodiment of this disclosure. In FIG. 27, portions identical or corresponding to those of FIG. 3 are referred to by the common symbols, and descriptions thereof will be omitted.

In FIG. 27, the gate wiring film 2 is formed on the glass substrate 1 as the translucent insulation substrate. The inorganic film 11 made of the insulator part 11a, which is formed by changing the oxide semiconductor into the insulator, is formed on the gate wiring film 2 to be in direct contact with the gate wiring film 2. The insulation film 10 is formed on the insulator part 11a to be in direct contact with the insulator part 11a which is obtained by changing the oxide semiconductor into the insulator.

Thereafter, the gate insulation film 13, the a-Si layer 4, the source wiring film 5, the source electrode 6, the drain electrode 7, the interlayer insulation film 14, the contact hole 8 and the pixel electrode 9 are formed, and thus a TFT array substrate 102a according to the third embodiment of this disclosure is obtained.

Next, a manufacturing method of the TFT array substrate 102b according to the third embodiment of this disclosure will be described. At first, the gate wiring film 2 is formed on the glass substrate 1. After forming the gate wiring film 2, the inorganic film 11 having the insulator part 11a, which is formed by changing the oxide semiconductor into the insulator, is formed to be in direct contact with the gate wiring film 2. After forming the inorganic film 11, the insulation film 10 primarily made of silicon oxide is formed to be in direct contact with the inorganic film 11.

Figure 33:
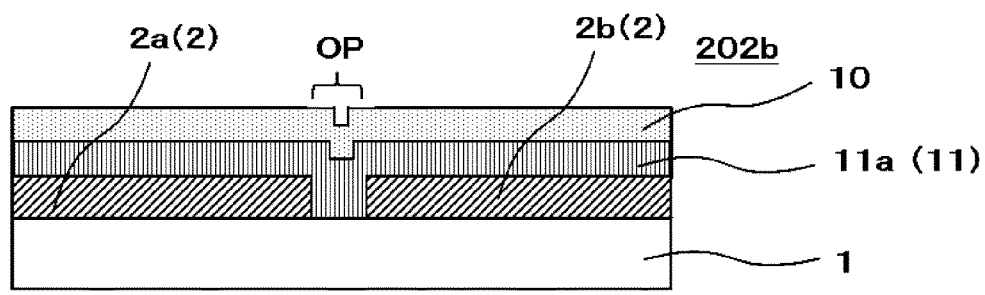
FIG. 33 is a cross-sectional view illustrating a TFT array substrate according to the third embodiment of this disclosure.

Explanation will be made as to the configuration of the TFT array substrate according to the third embodiment of this disclosure in a case where the gate wiring film 2 has a disconnection part OP. FIG. 33 is a cross-sectional view illustrating a TFT array substrate 202b according to the third embodiment of this disclosure. In the configuration of the TFT array substrate according to the third embodiment of this disclosure in the case of having the disconnection part OP, as shown in FIG. 33, the gate wiring film 2 is separated in the longitudinal direction in a manner of interposing the disconnection part OP. Thus, the first gate wiring film 2a and the second gate wiring film 2b being not in direct contact with the first gate wiring film 2a are formed. Since the remaining configuration of this TFT array substrate is the same as that in the case where the disconnection part OP is not formed as shown in FIG. 27, descriptions thereof will be omitted.

Explanation will be made as to an example of mechanism that the disconnection part OP occurs at the wiring, in the third embodiment according to this disclosure.

Figure 29:
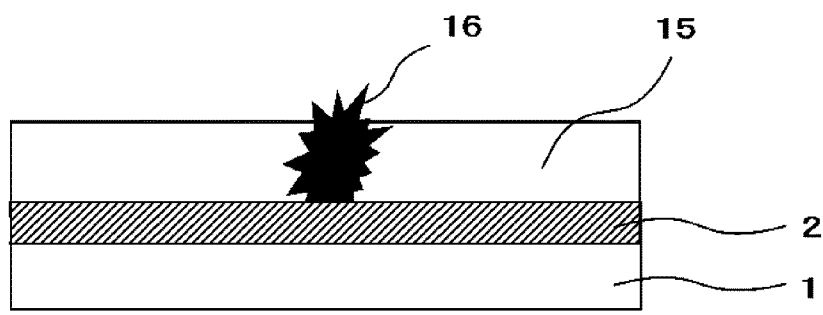
FIG. 29 is a cross-sectional view illustrating a part of manufacturing process of the TFT array substrate according to the third embodiment of this disclosure.
Figure 30:
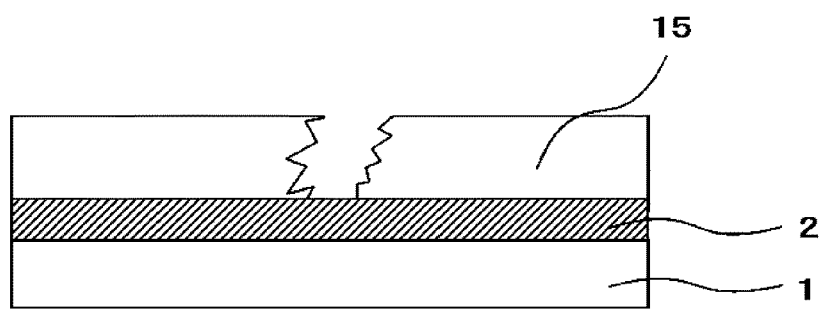
FIG. 30 is a cross-sectional view illustrating a part of the manufacturing process of the TFT array substrate according to the third embodiment of this disclosure.

FIGS. 29 to 32 are cross-sectional views illustrating parts of manufacturing process of the TFT array substrate 202b according to the third embodiment of this disclosure. FIG. 29 illustrates a case where foreign particle 16 is incorporated into the resist 15 in the photoengraving process. FIG. 30 is the cross-sectional view illustrating a state where the foreign particle 16 of FIG. 29 peels.

Figure 31:
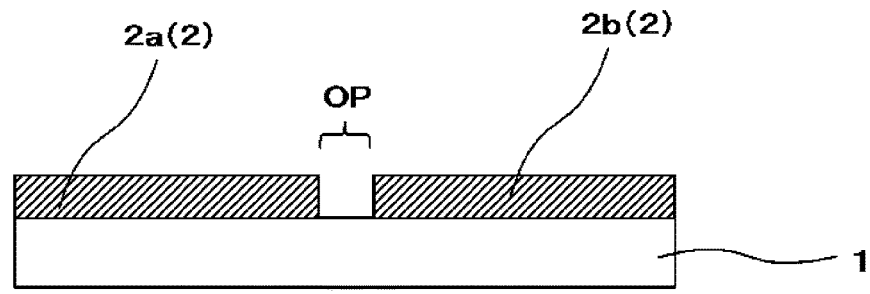
FIG. 31 is a cross-sectional view illustrating a part of the manufacturing process of the TFT array substrate according to the third embodiment of this disclosure.
Figure 32:
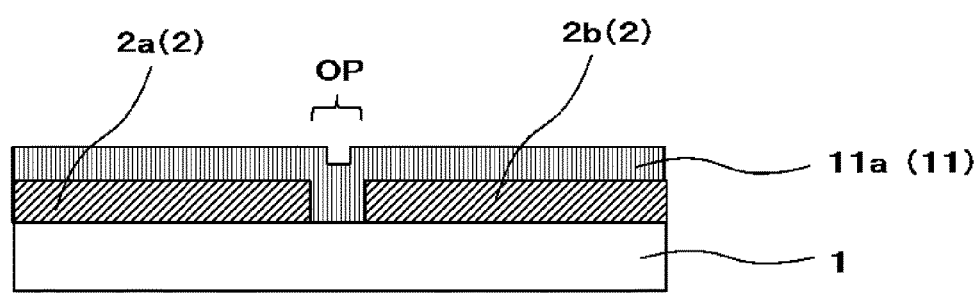
FIG. 32 is a cross-sectional view illustrating a part of the manufacturing process of the TFT array substrate according to the third embodiment of this disclosure.

As shown in FIG. 30, if the foreign particle 16 peels off, an unintentional portion not covered by the resist 15 appears in the gate wiring film. As shown in FIG. 31, at this portion not covered by the resist 15, the gate wiring film 2 is etched away in the etching step and the disconnection part OP appears. Thereafter, as shown in FIG. 32, the inorganic film 11 having the insulator part 11a, which is formed by changing the oxide semiconductor into the insulator, is formed to be in direct contact with the gate wiring film 2.

Next, configuration of the TFT array substrate according to the third embodiment of this disclosure which is subjected to connection repair in a case where the disconnection part OP is generated at the gate wiring film 2 will be described.

Figure 28:
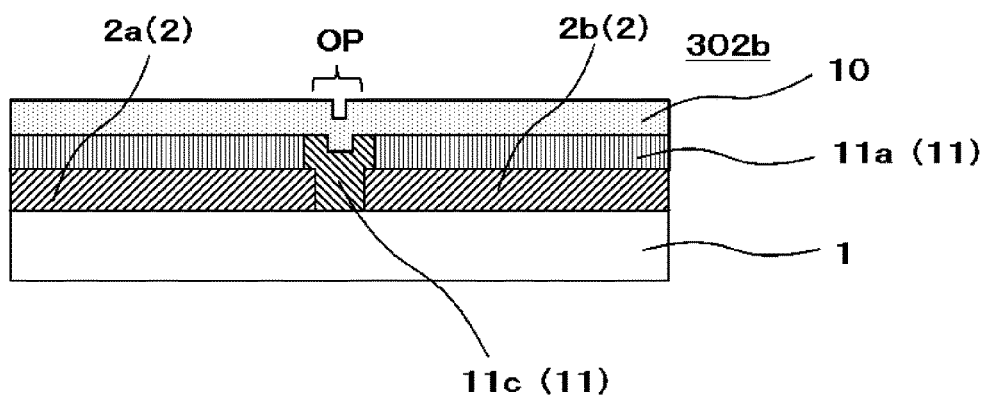
FIG. 28 is a cross-sectional view illustrating a TFT array substrate according to the third embodiment of this disclosure.

FIG. 28 is a cross-sectional view illustrating a TFT array substrate 302b according to the third embodiment of this disclosure. FIG. 28 illustrates a state where the conductor part 11c, which is formed by changing the oxide semiconductor film into the conductor, is formed at the disconnection part OP of the gate wiring film 2 in FIG. 33.

In addition to the configuration explained with reference to FIG. 33, as shown in FIG. 28, the inorganic film 11 has the conductor part 11c formed by changing the oxide semiconductor into the conductor, and the conductor part 11c is in direct contact with both the first gate wiring film 2a and the second gate wiring film 2b. Since the remaining configuration of this TFT array substrate is the same as that of the TFT array substrate in the state before forming the conductor part 11c, which is obtained by changing the oxide semiconductor film into the conductor, shown in FIG. 33, descriptions thereof will be omitted.

Figure 34:
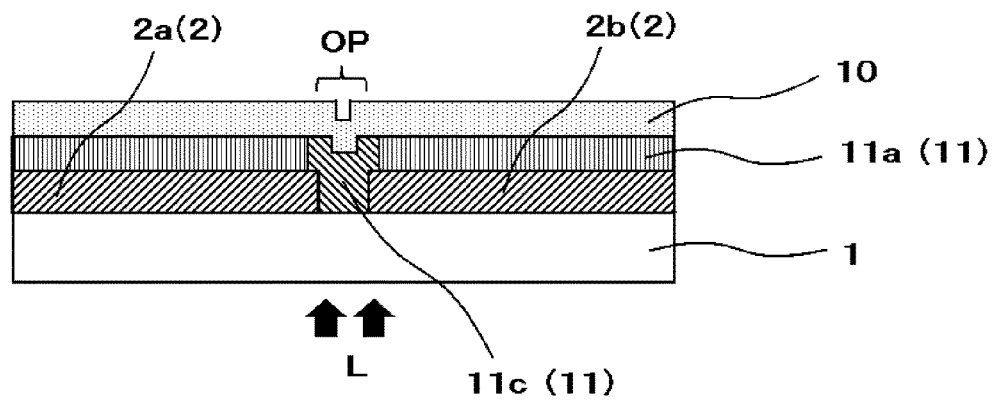
FIG. 34 is a cross-sectional view illustrating a part of the manufacturing process of the TFT array substrate according to the third embodiment of this disclosure.

Next, a method of manufacturing the TFT array substrate 302b by subjecting the TFT array substrate 202b according to the third embodiment of this disclosure to the connection repair will be described. FIG. 34 is a cross-sectional view illustrating a part of the manufacturing process of the TFT array substrate 302b according to the third embodiment of this disclosure. FIG. 34 illustrates the step of irradiating the disconnection part OP with ultraviolet rays L.

The ultraviolet rays L are irradiated on the disconnection part OP, by using the ultraviolet laser. As shown in FIG. 34, the ultraviolet rays L are irradiated in a direction toward the inorganic film 11 from the glass substrate 1, that is, toward the disconnection part OP from the rear surface side of the glass substrate 1. The ultraviolet rays L transmit the glass substrate 1 and are irradiated on the insulation film 10 and the insulator part 11a of the inorganic film 11.

When the ultraviolet rays L are irradiated on a portion where the insulator part 11a, which is formed by changing the oxide semiconductor film into the insulator, is in direct contact with the insulation film 10 made of the silicon oxide ($SiO_2$) film, electronic carriers of the oxide semiconductor film are effectively excited, and thus a specific resistance value of the oxide semiconductor film reduces. Thus, the insulator part 11a is changed into the conductor, whereby the conductor part 11c is formed. Since the conductor part 11c formed by changing the oxide semiconductor into the conductor is in direct contact with both the first gate wiring film 2a and the second gate wiring film 2b, the first gate wiring film 2a and the second gate wiring film 2b are electrically conducted to each other via the oxide semiconductor film that is changed into the conductor. As the connection repair is performed in this manner, the oxide semiconductor film that is changed into the conductor directly fits to the first gate wiring film 2a and the second gate wiring film 2b. Thus, conduction failure can be reduced as compared with the conventional art (see FIG. 28).

By performing the connection repair in this manner, the TFT array substrate 302b shown in FIG. 28 is obtained. Thereafter, the gate insulation film 13, the a-Si layer 4, the source wiring film 5, the source electrode 6, the drain electrode 7, the interlayer insulation film 14, the contact hole 8 and the pixel electrode 9 are formed, and thus the TFT array substrate 302a is obtained.

After forming the oriented film, etc., the CF substrate 22 is laminated on the TFT array substrate 302a via the seal member 21, and the liquid crystal 20 is filled in a region surrounded by the TFT array substrate 302a, the CF substrate 22 and the seal member 21, whereby a liquid crystal display device 600 as the display device is formed.

The TFT array substrate and the liquid crystal display device according to the third embodiment of this disclosure includes the insulator part 11a formed on the gate wiring film 2 to be in direct contact with the gate wiring film 2, and the insulation film 10 formed on the insulator part 11a to be in direct contact with the insulator part 11a. Therefore, even if disconnection occurs in the gate wiring film 2, the conduction failure occurring at the time of performing the connection repair can be reduced.

In the manufacturing method of the TFT array substrate and the manufacturing method of the liquid crystal display device according to the third embodiment of this disclosure, the step of forming the inorganic film 11 is performed after the step of forming the gate wiring film 2, and the step of forming the insulation film 10 is performed after the step of forming the inorganic film 11. Therefore, even if disconnection occurs in the gate wiring film 2, the conduction failure occurring at the time of performing the connection repair can be reduced.

Fourth Embodiment

A TFT array substrate according to the fourth embodiment of this disclosure differs from the first embodiment according to this disclosure in an order of laminating the insulation film 10, the gate wiring film 2 and the inorganic film 11.

Figure 35:
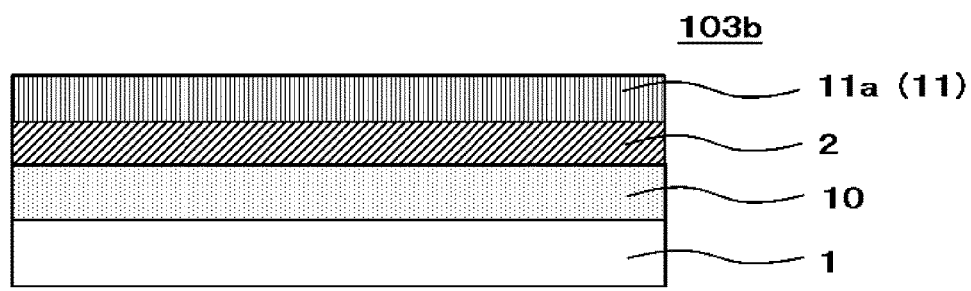
FIG. 35 is a cross-sectional view illustrating a TFT array substrate according to a fourth embodiment of this disclosure.

Configuration of a TFT array substrate 103b according to the fifth embodiment of this disclosure will be described. FIG. 35 is a cross-sectional view of the TFT array substrate 103b according to the fourth embodiment of this disclosure. In FIG. 35, portions identical or corresponding to those of FIG. 3 are referred to by the common symbols, and descriptions thereof will be omitted.

In FIG. 35, the insulation film 10 is formed on the glass substrate 1 as the translucent insulation substrate. The gate wiring film 2 is formed on the insulation film 10 to be in direct contact with the insulation film 10. The inorganic film 11 made of the insulator part 11a, which is formed by changing the oxide semiconductor into the insulator, is formed on the gate wiring film 2, to be in direct contact with the gate wiring film 2.

Thereafter, the gate insulation film 13, the a-Si layer 4, the source wiring film 5, the source electrode 6, the drain electrode 7, the interlayer insulation film 14, the contact hole 8 and the pixel electrode 9 are formed, and thus a TFT array substrate 103a according to the fourth embodiment of this disclosure is obtained.

Next, a manufacturing method of the TFT array substrate 103b according to the fourth embodiment of this disclosure will be described. At first, the insulation film 10 primarily made of silicon oxide is formed on the glass substrate 1. After forming the insulation film 10, the gate wiring film 2 is formed to be in direct contact with the insulation film 10. After forming the gate wiring film 2, the inorganic film 11 having the insulator part 11a, which is formed by changing the oxide semiconductor into the insulator, is formed to be in direct contact with the gate wiring film 2.

Figure 40:
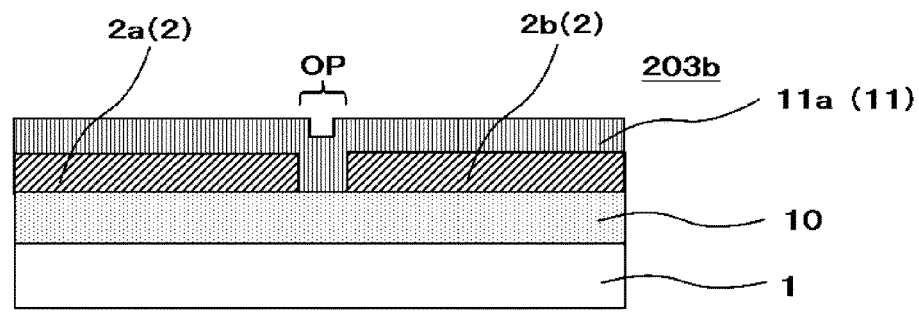
FIG. 40 is a cross-sectional view illustrating a TFT array substrate according to the fourth embodiment of this disclosure.

The configuration of the TFT array substrate according to the fourth embodiment of this disclosure in a case where the gate wiring film 2 has a disconnection part OP will be described. FIG. 40 is a cross-sectional view illustrating a TFT array substrate 203b according to the fourth embodiment of this disclosure. In the configuration of the TFT array substrate according to the fourth embodiment of this disclosure in the case of having the disconnection part OP, as shown in FIG. 40, the gate wiring film 2 is separated in the longitudinal direction in a manner of interposing the disconnection part OP. Thus, the first gate wiring film 2a and the second gate wiring film 2b being not in direct contact with the first gate wiring film 2a are formed. Since the remaining configuration of this TFT array substrate is the same as that in the case where the disconnection part OP is not formed as shown in FIG. 35, descriptions thereof will be omitted.

Explanation will be made as to an example of mechanism that the disconnection part OP occurs at the wiring, in the fourth embodiment according to this disclosure.

Figure 37:
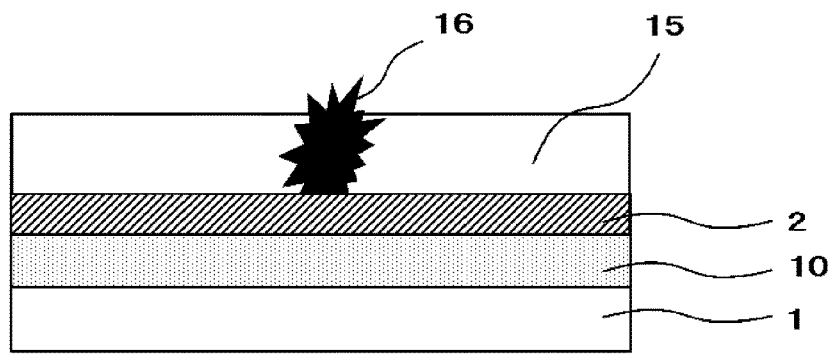
FIG. 37 is a cross-sectional view illustrating a part of manufacturing process of the TFT array substrate according to the fourth embodiment of this disclosure.
Figure 38:
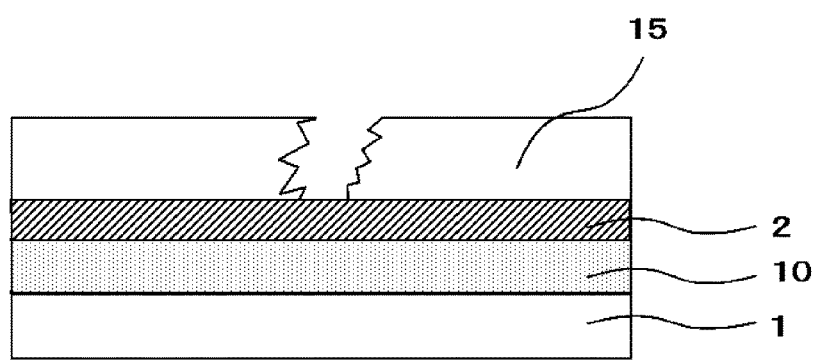
FIG. 38 is a cross-sectional view illustrating a part of the manufacturing process of the TFT array substrate according to the fourth embodiment of this disclosure.
Figure 39:
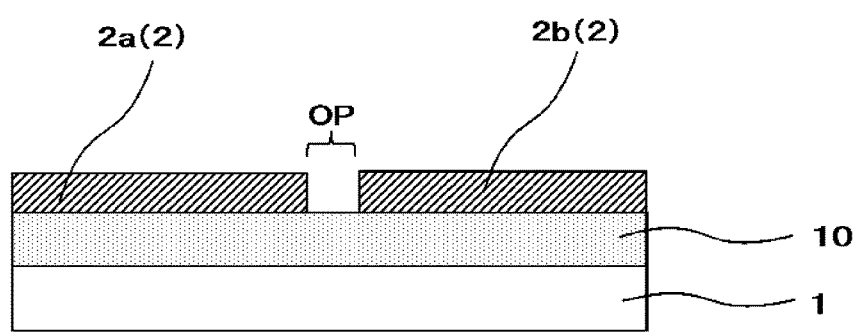
FIG. 39 is a cross-sectional view illustrating a part of the manufacturing process of the TFT array substrate according to the fourth embodiment of this disclosure.

FIGS. 37 to 39 are cross-sectional views illustrating parts of manufacturing process of the TFT array substrate 203b according to the fourth embodiment of this disclosure. FIG. 37 illustrates a case where foreign particle 16 is incorporated into the resist 15 in the photoengraving process. FIG. 38 is the cross-sectional view illustrating a state where the foreign particle 16 of FIG. 37 peels.

As shown in FIG. 38, if the foreign particle 16 peels off, an unintentional portion not covered by the resist 15 appears in the gate wiring film. As shown in FIG. 39, at this portion not covered by the resist 15, the gate wiring film 2 is etched away in the etching step and the disconnection part OP appears.

Next, the configuration of the TFT array substrate according to the fourth embodiment of this disclosure which is subjected to connection repair in a case where the disconnection part OP is generated at the gate wiring film 2 will be described.

Figure 36:
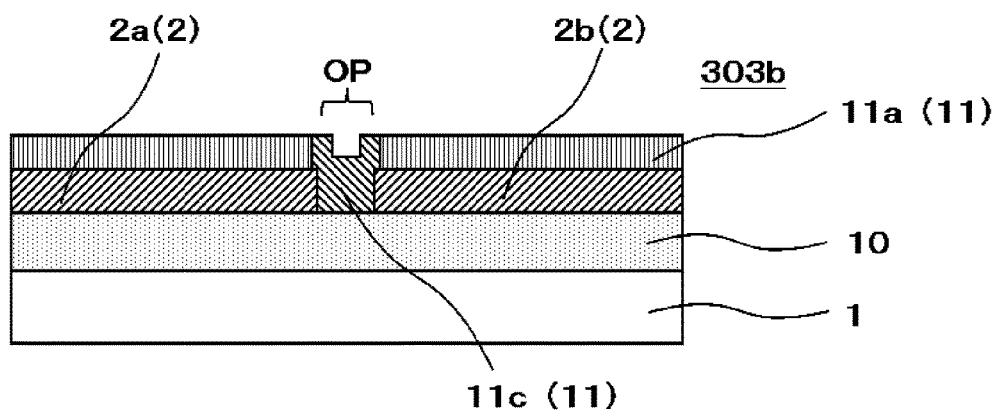
FIG. 36 is a cross-sectional view illustrating a TFT array substrate according to the fourth embodiment of this disclosure.

FIG. 36 is a cross-sectional view illustrating a TFT array substrate 303b according to the fourth embodiment of this disclosure. FIG. 36 illustrates a state where the conductor part 11c, which is formed by changing the oxide semiconductor film into the conductor, is formed at the disconnection part OP of the gate wiring film 2 in FIG. 40.

In addition to the configuration explained with reference to FIG. 40, as shown in FIG. 36, the inorganic film 11 has the conductor part 11c formed by changing the oxide semiconductor into the conductor, and the conductor part 11c is in direct contact with both the first gate wiring film 2a and the second gate wiring film 2b. Since the remaining configuration of this TFT array substrate is the same as that of the TFT array substrate in the state before forming the conductor part 11c, which is obtained by changing the oxide semiconductor film into the conductor, shown in FIG. 40, descriptions thereof will be omitted.

Figure 41:
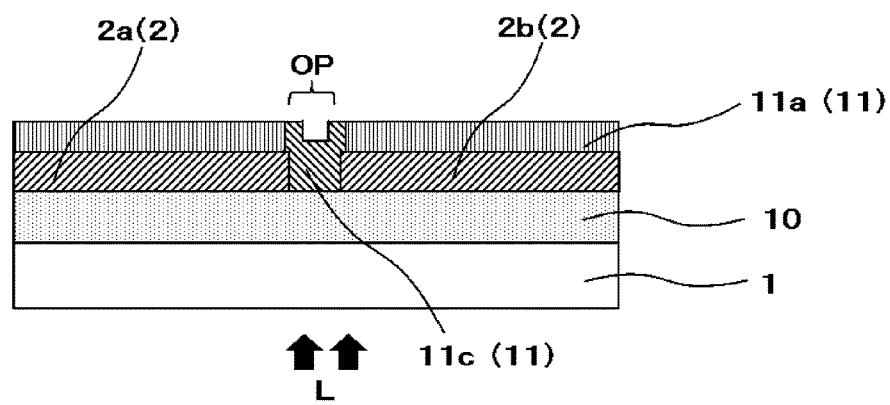
FIG. 41 is a cross-sectional view illustrating a part of the manufacturing process of the TFT array substrate according to the fourth embodiment of this disclosure.

Next, a method of manufacturing the TFT array substrate 303b by subjecting the TFT array substrate 203b according to the fourth embodiment of this disclosure to the connection repair will be described. FIG. 41 is a cross-sectional view illustrating a part of the manufacturing process of the TFT array substrate 303b according to the fourth embodiment of this disclosure. FIG. 41 illustrates the step of irradiating the disconnection part OP with ultraviolet rays L.

The ultraviolet rays L are irradiated on the disconnection part OP, by using the ultraviolet laser. As shown in FIG. 41, the ultraviolet rays L are irradiated in a direction toward the inorganic film 11 from the glass substrate 1, that is, toward the disconnection part OP from the rear surface side of the glass substrate 1. The ultraviolet rays L transmit the glass substrate 1 and are irradiated on the insulation film 10 and the insulator part 11a of the inorganic film 11.

When the ultraviolet rays L are irradiated on a portion where the insulator part 11a, which is formed by changing the oxide semiconductor film into the insulator, is in direct contact with the insulation film 10 made of the silicon oxide ($SiO_2$) film, electronic carriers of the oxide semiconductor film are effectively excited, and thus a specific resistance value of the oxide semiconductor film reduces. Thus, the insulator part 11a is changed into the conductor, whereby the conductor part 11c is formed. As the conductor part 11c formed by changing the oxide semiconductor into the conductor is in direct contact with both the first gate wiring film 2a and the second gate wiring film 2b, the first gate wiring film 2a and the second gate wiring film 2b are electrically conducted to each other via the oxide semiconductor film that is changed into the conductor. As the connection repair is performed in this manner, the oxide semiconductor film that is changed into the conductor directly fits to the first gate wiring film 2a and the second gate wiring film 2b. Thus, conduction failure can be reduced as compared with the conventional art (see FIG. 36).

By performing the connection repair in this manner, the TFT array substrate 303b shown in FIG. 36 is obtained. Thereafter, the gate insulation film 13, the a-Si layer 4, the source wiring film 5, the source electrode 6, the drain electrode 7, the interlayer insulation film 14, the contact hole 8 and the pixel electrode 9 are formed, and thus the TFT array substrate 303a is obtained.

After forming the oriented film, etc., the CF substrate 22 is stacked on the TFT array substrate 302a via the seal member 21, and the liquid crystal 20 is filled in a region surrounded by the TFT array substrate 303a, the CF substrate 22 and the seal member 21, whereby a liquid crystal display device 700 as the display device is formed.

The TFT array substrate and the liquid crystal 20 display device according to the fourth embodiment of this disclosure includes the gate wiring film 2 formed on the insulation film 10 to be in direct contact with the insulation film 10 and the insulator part 11a formed on the gate wiring film 2 to be in direct contact with the gate wiring film 2. Therefore, even if disconnection occurs in the gate wiring film 2, the conduction failure occurring at the time of performing the connection repair can be reduced.

In the manufacturing method of the TFT array substrate and the manufacturing method of the liquid crystal 20 display device according to the fourth embodiment of this disclosure, the step of forming the gate wiring film 2 is performed after the step of forming the insulation film 10, and the step of forming the inorganic film 11 is performed after the step of forming the gate wiring film 2. Therefore, even if disconnection occurs in the gate wiring film 2, the conduction failure occurring at the time of performing the connection repair can be reduced.

Fifth Embodiment

A TFT array substrate according to the fifth embodiment of this disclosure differs from the first embodiment according to this disclosure in that, in a planar view, the insulation film 10 contains the gate wiring film 2 in a transversal direction of the gate wiring film 2.

Figure 45:
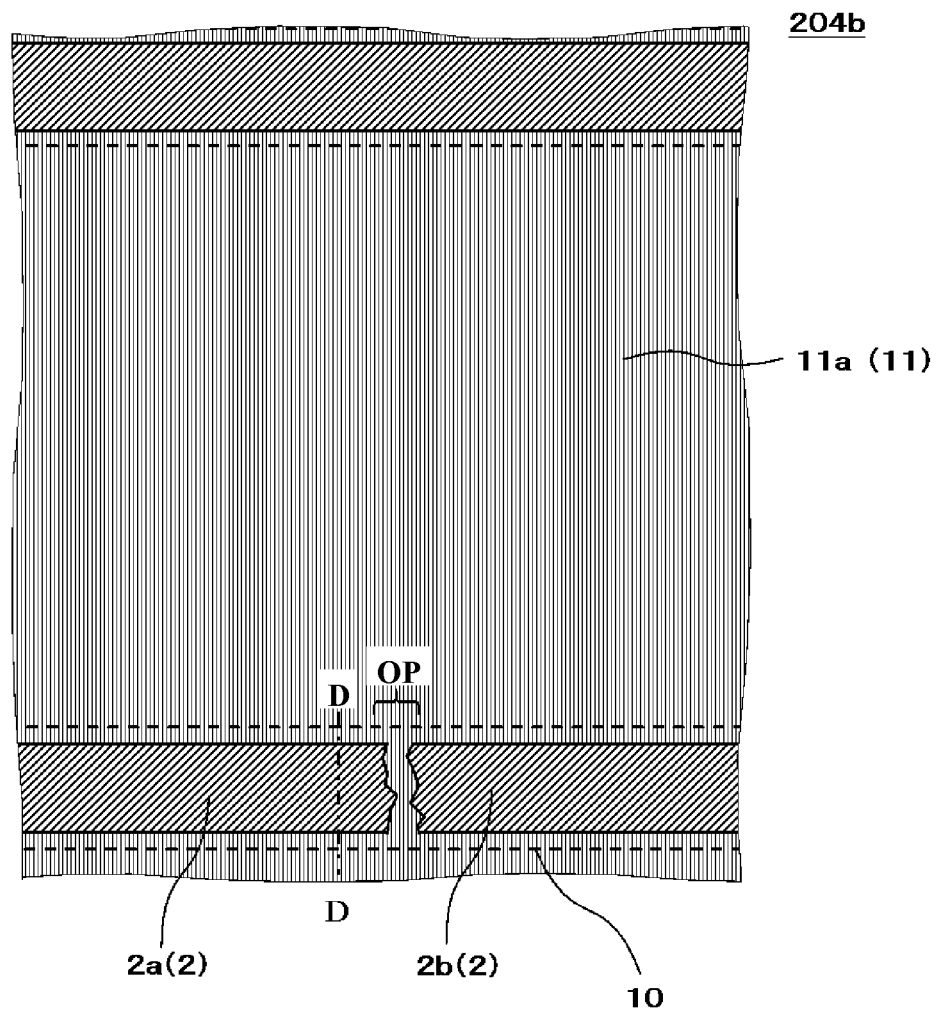
FIG. 45 is a top view illustrating a TFT array substrate according to the fifth embodiment of this disclosure.

Firstly, explanation will be made as to configurations of a TFT array substrate 204b according to the fifth embodiment of this disclosure. FIG. 45 is a top view illustrating the TFT array substrate 204b according to the fifth embodiment of this disclosure. In FIG. 45, portions identical or corresponding to those of FIG. 10 are referred to by the common symbols, and descriptions thereof will be omitted.

Figure 42:
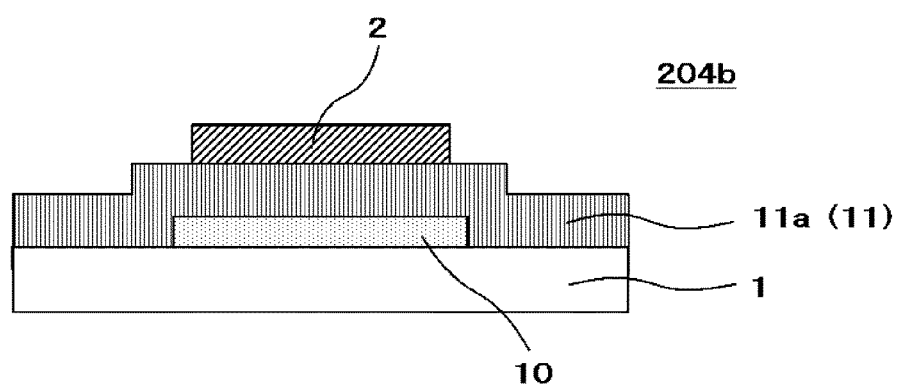
FIG. 42 is a cross-sectional view illustrating a TFT array substrate according to a fifth embodiment of this disclosure.

FIG. 42 is a cross-sectional view of the TFT array substrate 204b according to the fifth embodiment of this disclosure. FIG. 42 is the cross-sectional view taken along line D-D in the transversal direction of the gate wiring film 2 in the TFT array substrate 204b of FIG. 45.

In FIG. 42, the insulation film 10 is patterned on the glass substrate 1. As shown in FIGS. 42 and 45, in a planar view, the insulation film 10 contains the gate wiring film 2 in the transversal direction of the gate wiring film 2. Specifically the insulation film is larger than the gate wiring film by about 1 μm in the transversal direction of the gate wiring film 2.

Secondly, a manufacturing method of the TFT array substrate 204b according to the fifth embodiment of this disclosure will be described. At first, an $SiO_2$ film is formed on the entire surface of the glass substrate 1 to have a thickness of about 50 nm by using the CVD device, whereby the insulation film 10 is formed Thereafter, a photoengraving process for forming a resist pattern is performed on the insulation film 10 so that, in a planar view, the resist pattern contains an expected region of the gate wiring film 2 to be formed, in the transversal direction of the expected region of the gate wiring film 2 to be formed. Thereafter, a dry etching process for removing the insulation film 10 not covered by the resist 15 is performed.

Succeeding steps are the same as those of the manufacturing method of the TFT array substrate according to the first embodiment of this disclosure, descriptions thereof will be omitted.

Figure 43:
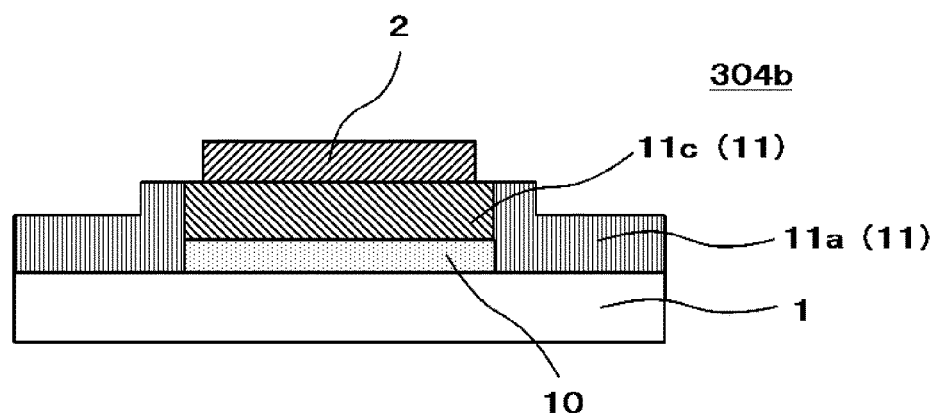
FIG. 43 is a cross-sectional view illustrating a TFT array substrate according to the fifth embodiment of this disclosure.
Figure 46:
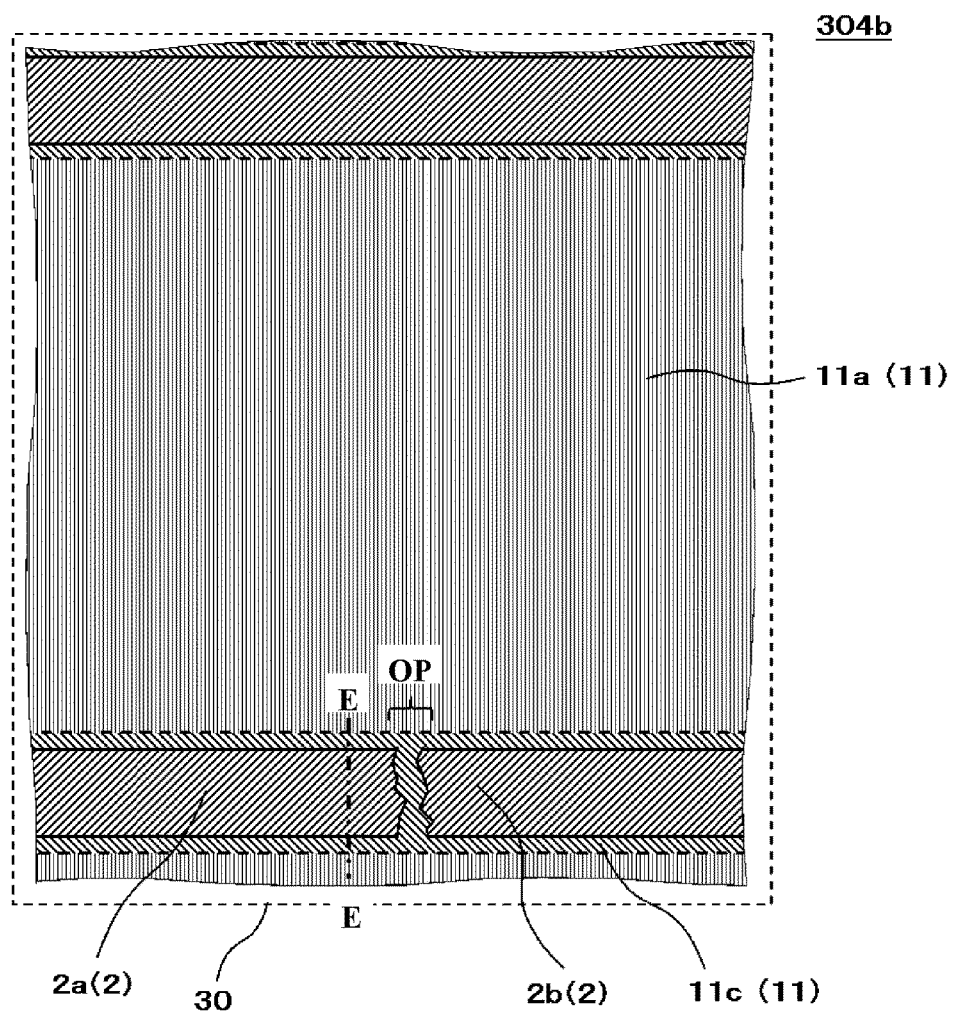
FIG. 46 is a top view illustrating a TFT array substrate according to the fifth embodiment of this disclosure.

Thirdly, explanation will be made as to configuration of the TFT array substrate according to the fifth embodiment of this disclosure which is subjected to connection repair. FIG. 46 is a top view illustrating a TFT array substrate 304b according to the fifth embodiment of this disclosure. In FIG. 46, portions identical or corresponding to those of FIG. 12 are referred to by the common symbols, and descriptions thereof will be omitted. FIG. 43 is a cross-sectional view of the TFT array substrate 304b according to the fifth embodiment of this disclosure. FIG. 43 is the cross-sectional view taken along line E-E in the transversal direction of the gate wiring film 2 in the TFT array substrate 304b of FIG. 46.

In FIG. 43, the inorganic film 11, which has the insulator part 11a formed by changing the oxide semiconductor into the insulator and the conductor part 11c formed of the oxide semiconductor, is formed on the insulation film 10 to be in direct contact with the insulation film 10. Further, the gate wiring film 2 is formed on the inorganic film 11 to be in direct contact with the inorganic film 11 having the insulator part 11a and the conductor part 11c.

In addition to the configuration of the TFT array substrate 204b, as shown in FIG. 43, the inorganic film 11 has the conductor part 11c formed by changing the oxide semiconductor into the conductor, and the conductor part 11c is in direct contact with the gate wiring film 2. Since the remaining configuration of this TFT array substrate is the same as that of the TFT array substrate in the state before forming the conductor part 11c, obtained by changing the oxide semiconductor film into the conductor, shown in FIG. 42, descriptions thereof will be omitted.

Figure 44:
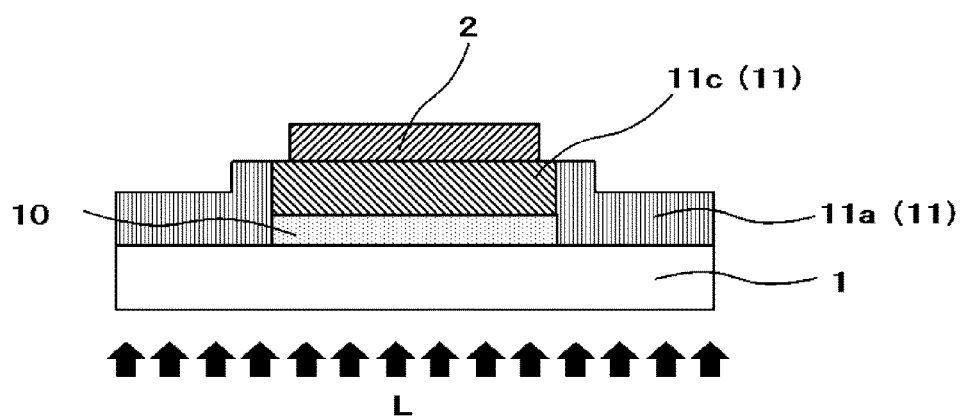
FIG. 44 is a cross-sectional view illustrating a part of manufacturing process of the TFT array substrate according to the fifth embodiment of this disclosure.

Fourthly, a method of manufacturing the TFT array substrate 304b by subjecting the TFT array substrate 204b according to the fifth embodiment of this disclosure to the connection repair will be described. FIG. 44 is a cross-sectional view illustrating a part of the manufacturing process of the TFT array substrate according to the fifth embodiment of this disclosure. FIG. 44 illustrates a process of irradiating the TFT array substrate with the ultraviolet rays L.

In FIGS. 44 and 46, the ultraviolet rays L are irradiated on the entire surface of the glass substrate 1, by using the ultraviolet laser. As shown in FIG. 44, the ultraviolet rays L are irradiated in a direction toward the inorganic film 11 from the glass substrate 1, that is, irradiated from the rear surface side of the glass substrate 1. The ultraviolet rays L are irradiated on the entire surface of the glass substrate 1 and transmit the glass substrate 1. When the ultraviolet rays L are irradiated in this manner, the insulator part 11a only at a region, where the insulation film 10 formed so as to contain the gate wiring film 2 contacts the insulator part 11a formed by changing the oxide semiconductor into the insulator, is changed into the conductor, and thus the conductor part 11c is formed.

Thus, in the fifth embodiment according to this disclosure, it is not necessary to detect the disconnection part OP by the defect inspection apparatus or the like, but it is merely required to irradiate the ultraviolet rays L on the entire surface of the glass substrate 1 from the rear surface side of the glass substrate 1, by using the ultraviolet laser. As a result, the insulator part 11a at a region of the insulation film 10 containing the gate wiring film 2 in the transversal direction of the gate wiring film 2 in a planar view is changed into the conductor, whereby the conductor part 11c is formed (FIGS. 43, 46).

By performing the connection repair in this manner, the TFT array substrate 304b shown in FIGS. 43 and 46 is obtained. Thereafter, the gate insulation film 13, the a-Si layer 4, the source wiring film 5, the source electrode 6, the drain electrode 7, the interlayer insulation film 14, the contact hole 8 and the pixel electrode 9 are formed, and thus the TFT array substrate 304a is obtained.

After forming the oriented film, etc., the CF substrate 22 is laminated on the TFT array substrate 304a via the seal member 21, and the liquid crystal 20 is filled in a region surrounded by the TFT array substrate 304a, the CF substrate 22 and the seal member 21, whereby a liquid crystal display device 800 as the display device is formed.

In The TFT array substrate and the liquid crystal display device according to the fifth embodiment of this disclosure, the insulation film 10 is configured to contain the gate wiring film 2 in the transversal direction of the gate wiring film 2 in the planar view. Thus, the conductor part 11a being in direct contact with the insulation film 10 is changed into the conductor and thus the conductor part 11c is formed, by merely irradiating the entire surface of the glass substrate 1 with the ultraviolet rays L without detecting the disconnection part OP by the defect inspection apparatus or the like. As the connection repair is performed in this manner, the processing can be simplified and the productivity can be improved advantageously.

According to the manufacturing method of the TFT array substrate and the manufacturing method of the liquid crystal display device according to the fifth embodiment of this disclosure, in the step of forming the insulation film 10, the insulation film 10 is formed to contain the gate wiring film 2 in the transversal direction of the gate wiring film 2 in the planar view. Thus, the insulator part 11a being in direct contact with the insulation film 10 is changed into the conductor and thus the conductor part 11c is formed, by merely irradiating the ultraviolet rays L on the entire surface of the glass substrate without detecting the disconnection part OP by the defect inspection apparatus or the like. As the connection repair is performed in this manner, the processing can be simplified and the productivity can be improved advantageously.

In the fifth embodiment according to this disclosure, the explanation is made as to the case where the insulator part 11a contains the gate wiring film 2 in the transversal direction of the gate wiring film 2. However, the effect similar to that of the fifth embodiment can be obtained also in a case where the insulator part 11a is contained in the gate wiring film 2 in the transversal direction of the gate wiring film 2, for example.

Sixth Embodiment

A TFT array substrate according to the sixth embodiment of this disclosure differs from the first embodiment according to this disclosure in a point of taking a notice of the source wiring film 5 as an example of the wiring film and also in that the inorganic film 11 has the semiconductor part 11b formed of the oxide semiconductor.

Figure 47:
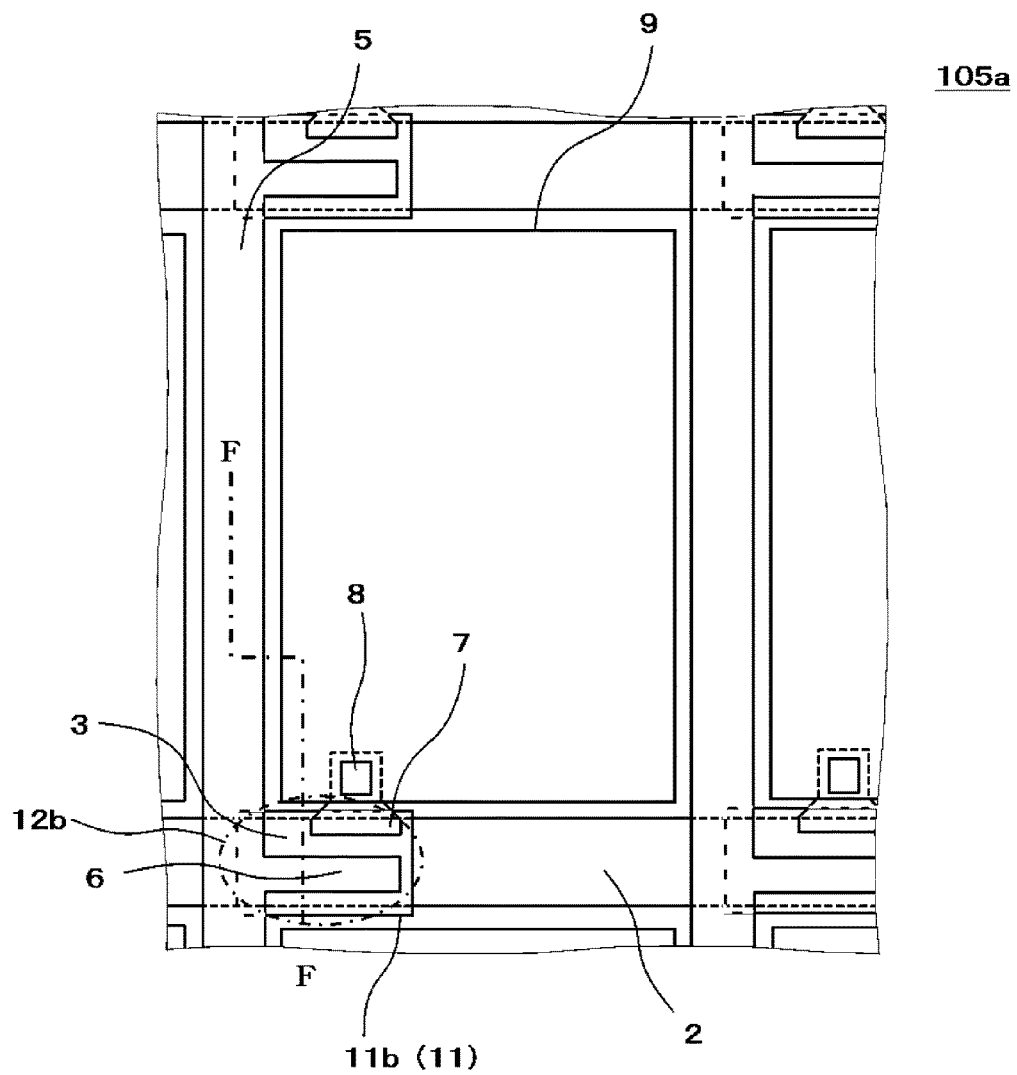
FIG. 47 is a top view illustrating a TFT array substrate according to a sixth embodiment of this disclosure.

Firstly, explanation will be made as to configurations of TFT array substrates 105a and 105b according to the sixth embodiment of this disclosure. FIG. 47 is a top view illustrating the TFT array substrate 105a according to the sixth embodiment of this disclosure.

Figure 48:
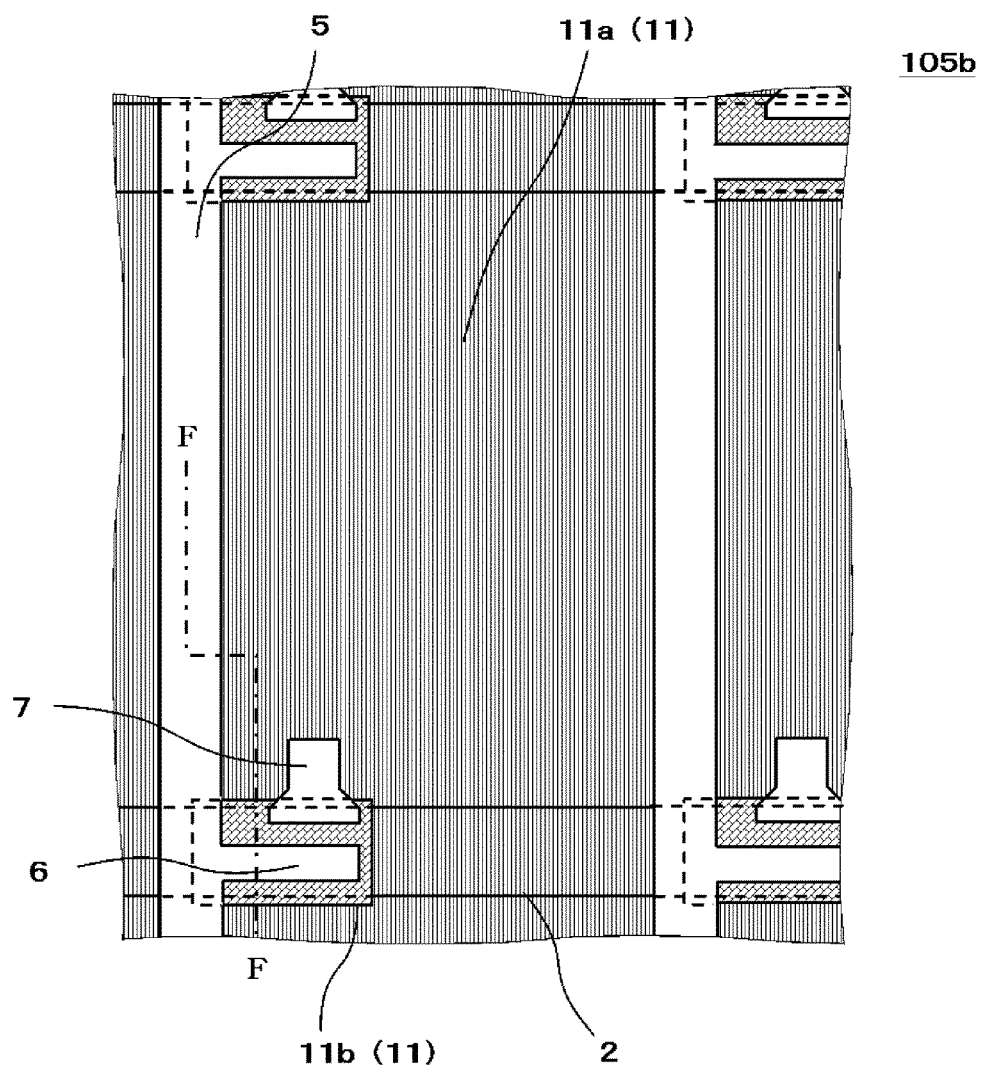
FIG. 48 is a top view illustrating a TFT array substrate according to the sixth embodiment of this disclosure.
Figure 49:
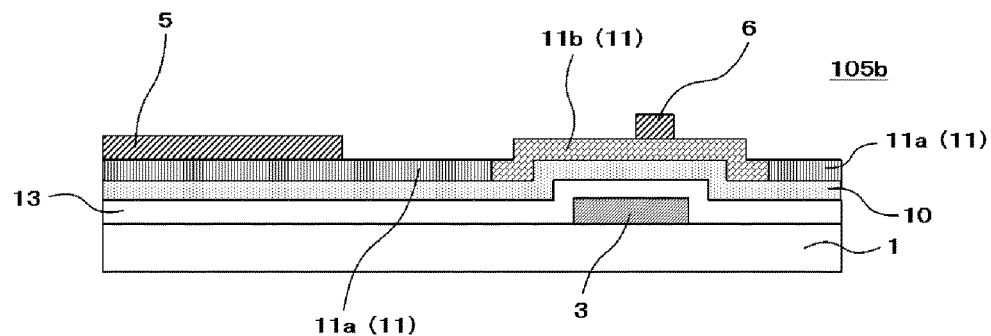
FIG. 49 is a cross-sectional view illustrating the TFT array substrate according to the sixth embodiment of this disclosure.

FIG. 48 is a top view illustrating the TFT array substrate 105b according to the sixth embodiment of this disclosure. FIG. 48 corresponds to the TFT array substrate 105a of FIG. 47 in a stage before forming the insulation film 10, the interlayer insulation film 14, the contact hole 8 and the pixel electrode 9. FIG. 49 is a cross-sectional view illustrating the TFT array substrate 105b according to the sixth embodiment of this disclosure. FIG. 49 is the cross-sectional view taken along line F-F including a section in parallel to a longitudinal direction of the source wiring film 5 in FIG. 48.

In FIG. 49, the insulation film 10 is formed on the glass substrate 1 so as to sandwich the gate electrode 3 and the gate insulation film 13 therebetween.

The inorganic film 11, which has the insulator part 11a formed by changing the oxide semiconductor into the insulator and the semiconductor part 11b formed of the oxide semiconductor, is formed on the insulation film 10 to be in direct contact with the insulation film 10.

The source wiring film 5, as a wiring film for forming a source wiring, is formed on the inorganic film 11 to be in direct contact with the inorganic film 11 having the insulator part 11a and the semiconductor part 11b.

The source wiring film 5 is formed of metal, for example, aluminum, aluminum alloy, molybdenum, molybdenum alloy or copper.

For example, the source wiring film 5 has a thickness of 50 nm to 1 μm. This film thickness is preferably 50 nm or more in a view point of lowering a resistance value. On the other hand, this film thickness is preferably 1 μm or less in a view point of productivity. More preferably, this film has the thickness of 100 nm to 500 nm.

Secondly, a manufacturing method of the TFT array substrate 105b according to the sixth embodiment of this disclosure will be described. FIGS. 50 to 58 are cross-sectional views illustrating parts of manufacturing process of the TFT array substrate 105b according to the sixth embodiment of this disclosure.

Figure 50:
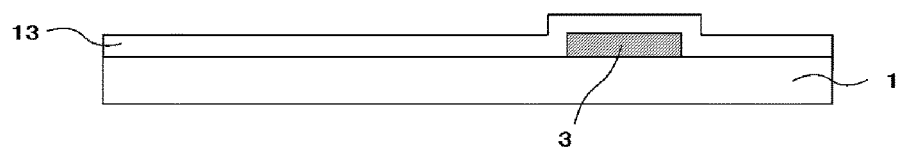
FIG. 50 is a cross-sectional view illustrating a part of manufacturing process of the TFT array substrate according to the sixth embodiment of this disclosure.

At first, the gate electrode 3 and the gate insulation film 13 are formed on the glass substrate 1. The gate insulation film 13 is formed in a manner where a silicon nitride (SiN) film is formed to have a thickness of 400 nm on the entire surface of the gate electrode 3 by using the CVD device (FIG. 50).

For example, the gate insulation film 13 has the thickness of 1 nm to 1 μm. This film thickness is preferably 1 nm or more in a view point of forming a uniform film and obtaining a function of the insulation film. On the other hand, this film thickness is preferably 1 μm or less in a view point of productivity. More preferably, this film has the thickness of 10 nm to 500 nm.

Figure 51:
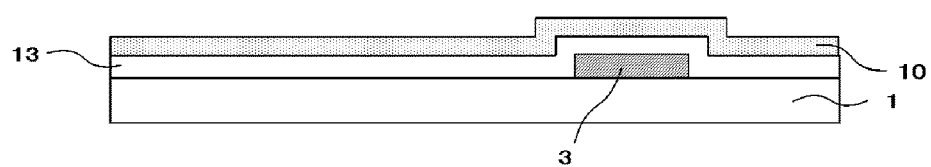
FIG. 51 is a cross-sectional view illustrating a part of the manufacturing process of the TFT array substrate according to the sixth embodiment of this disclosure.

At first, an $SiO_2$ film is formed to have a thickness of about 50 nm on the entire surface of the gate insulation film by using the CVD device, whereby the insulation film 10 is formed (FIG. 51).

Figure 52:
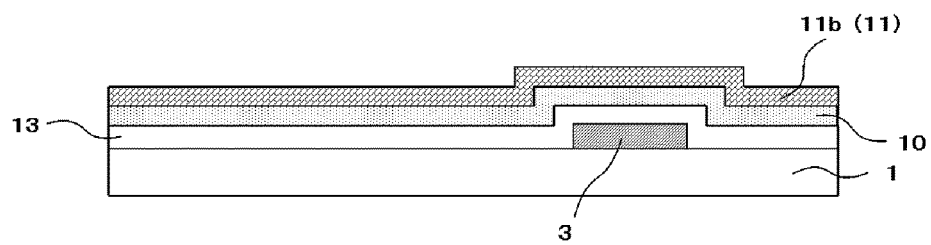
FIG. 52 is a cross-sectional view illustrating a part of the manufacturing process of the TFT array substrate according to the sixth embodiment of this disclosure.

Next, an InGaZnO film as the oxide semiconductor film is formed to have a thickness of about 80 nm on the entire surface of the insulation film under a condition to obtain property of semiconductor, by using the sputtering device, whereby the inorganic film 11 made of the semiconductor part 11b is formed (FIG. 52). Specifically, this film is formed under a condition that a partial pressure of oxygen with respect to Ar (argon) is set to about 9% in the sputtering.

Figure 53:
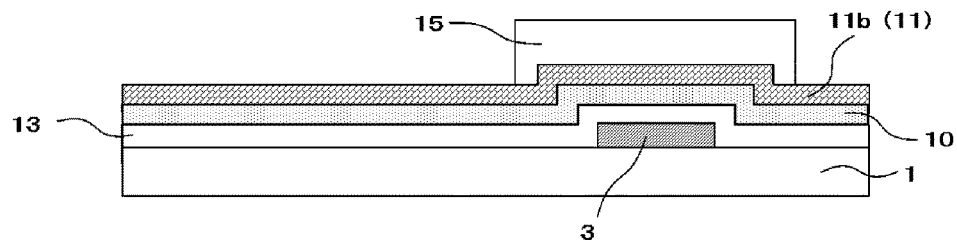
FIG. 53 is a cross-sectional view illustrating a part of the manufacturing process of the TFT array substrate according to the sixth embodiment of this disclosure.

Next, a photoengraving process for leaving the semiconductor part 11b forming a TFT 12b is performed, whereby the resist 15 is formed at the TFT part (FIG. 53).

Figure 54:
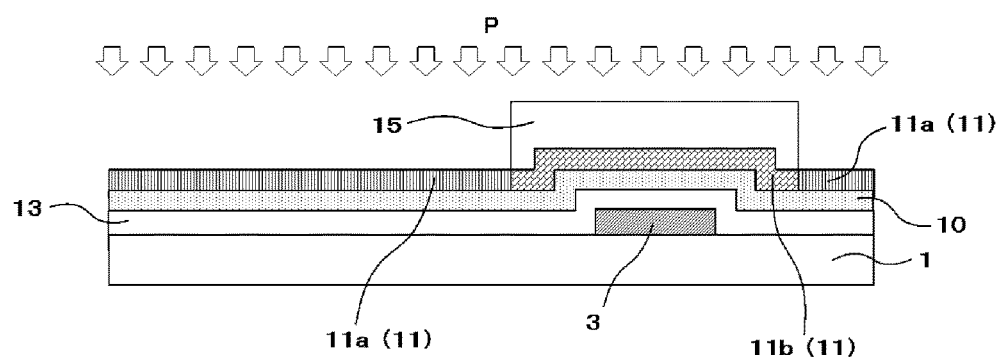
FIG. 54 is a cross-sectional view illustrating a part of the manufacturing process of the TFT array substrate according to the sixth embodiment of this disclosure.
Figure 55:
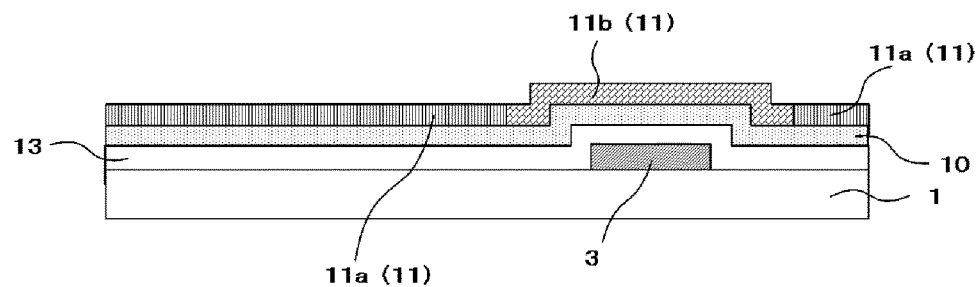
FIG. 55 is a cross-sectional view illustrating a part of the manufacturing process of the TFT array substrate according to the sixth embodiment of this disclosure.

Next the InGaZnO is changed to the insulator from the semiconductor by implementing the plasma process ($N_2O$ plasma process) P by using the nitrous oxide ($N_2O$) gas, and thus the inorganic film 11, which has the insulator part 11a at the portion not covered by the resist 15, is formed (FIG. 54). Thereafter, the resist 15 is removed (FIG. 55).

Figure 56:
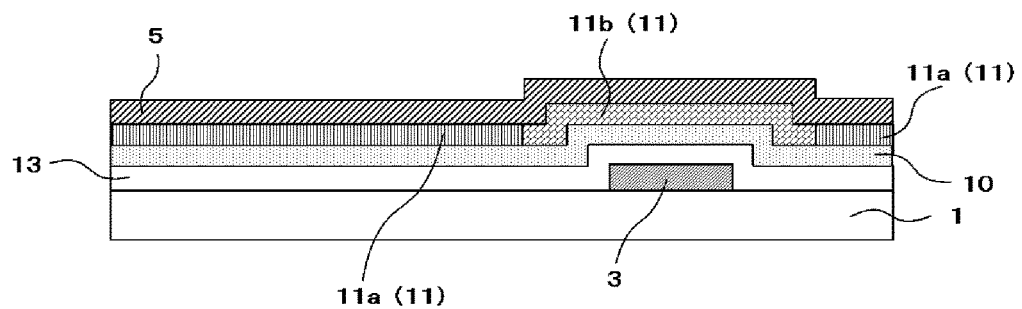
FIG. 56 is a cross-sectional view illustrating a part of the manufacturing process of the TFT array substrate according to the sixth embodiment of this disclosure.
Figure 57:
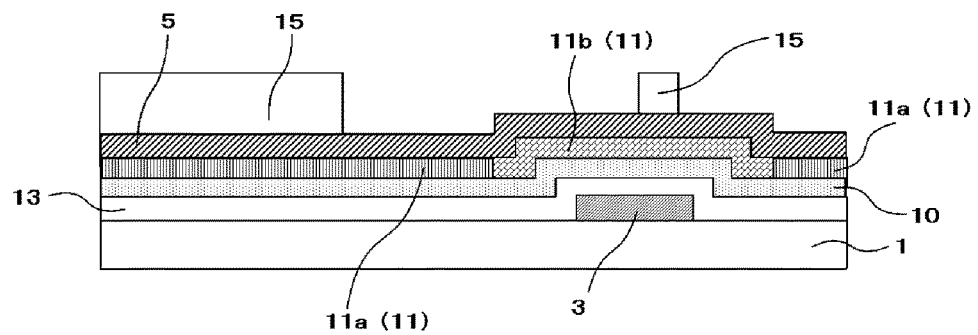
FIG. 57 is a cross-sectional view illustrating a part of the manufacturing process of the TFT array substrate according to the sixth embodiment of this disclosure.
Figure 58:
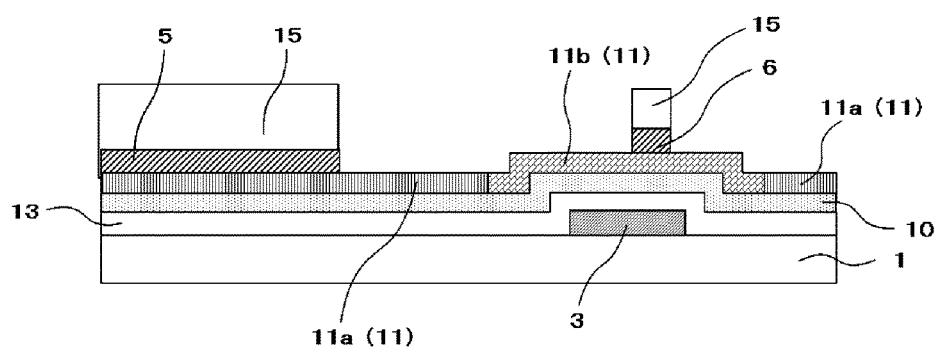
FIG. 58 is a cross-sectional view illustrating a part of the manufacturing process of the TFT array substrate according to the sixth embodiment of this disclosure.

Next, an aluminum-nickel-neodymium (AlNiNd) film is formed to have a thickness of about 200 nm by using the sputtering device, whereby the source wiring film 5 is formed (FIG. 56). Thereafter, the photoengraving process for forming the wiring pattern, etc. is performed on the source wiring film 5 by using the resist 15 (FIG. 57), and the etching process for removing portions of the source wiring film 5 not covered by the resist 15 is performed (FIG. 58). Then the resist 15 is removed and thus the TFT array substrate 105b shown in FIGS. 48 and 49 is obtained.

Thereafter, the insulation film 10, the interlayer insulation film 14, the contact hole 8 and the pixel electrode 9 are formed, and thus the TFT array substrate 105a shown in FIG. 47 is obtained.

Figure 59:
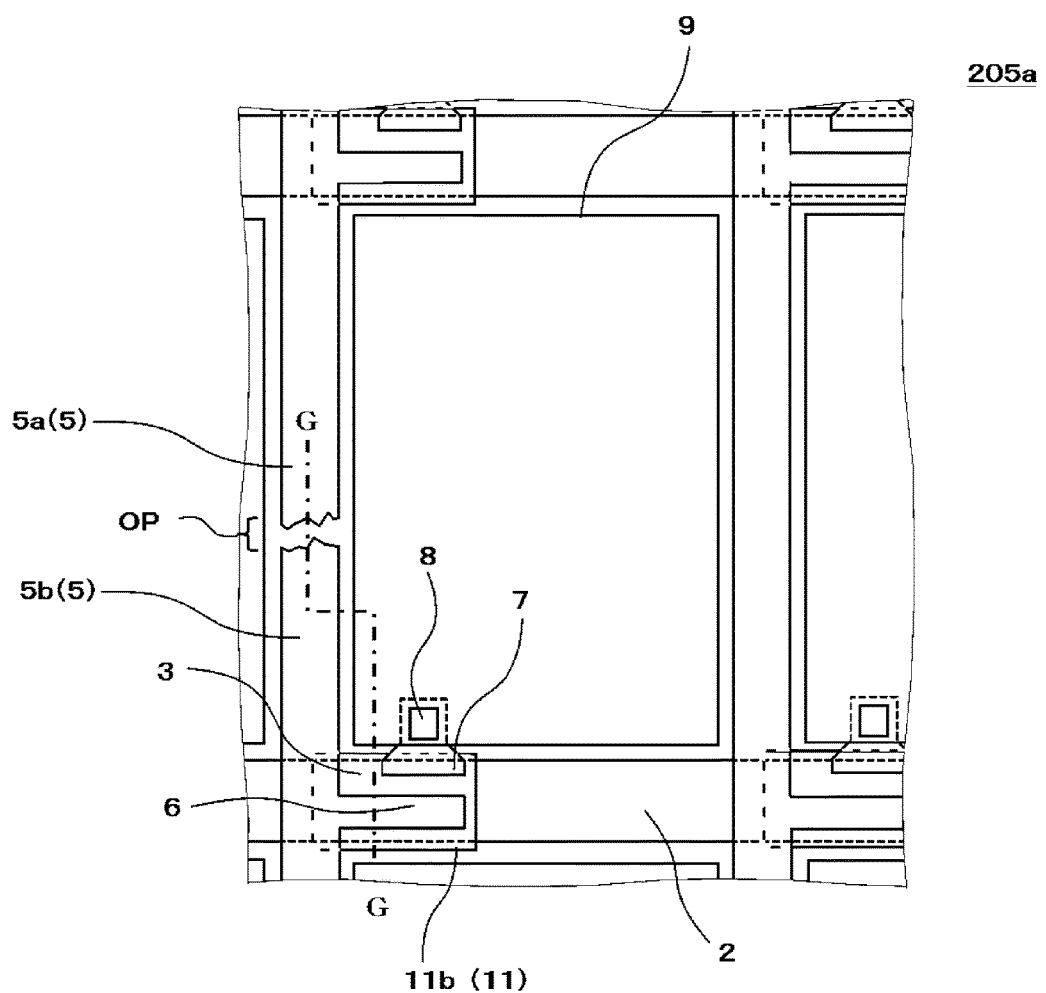
FIG. 59 is a top view illustrating a TFT array substrate according to the sixth embodiment of this disclosure.

Thirdly, configurations of the TFT array substrates 105a, 105b according to the sixth embodiment of this disclosure in a case where the source wiring film 5 has a disconnection part OP will be described. FIG. 59 is a top view illustrating a TFT array substrate 205a having the disconnection part OP at the source wiring film 5, according to the sixth embodiment of this disclosure. The TFT array substrate 205a shown in FIG. 59 has the same configuration as the TFT array substrate shown in FIG. 47 except for that the source wiring film 5 has the disconnection part OP.

Figure 60:
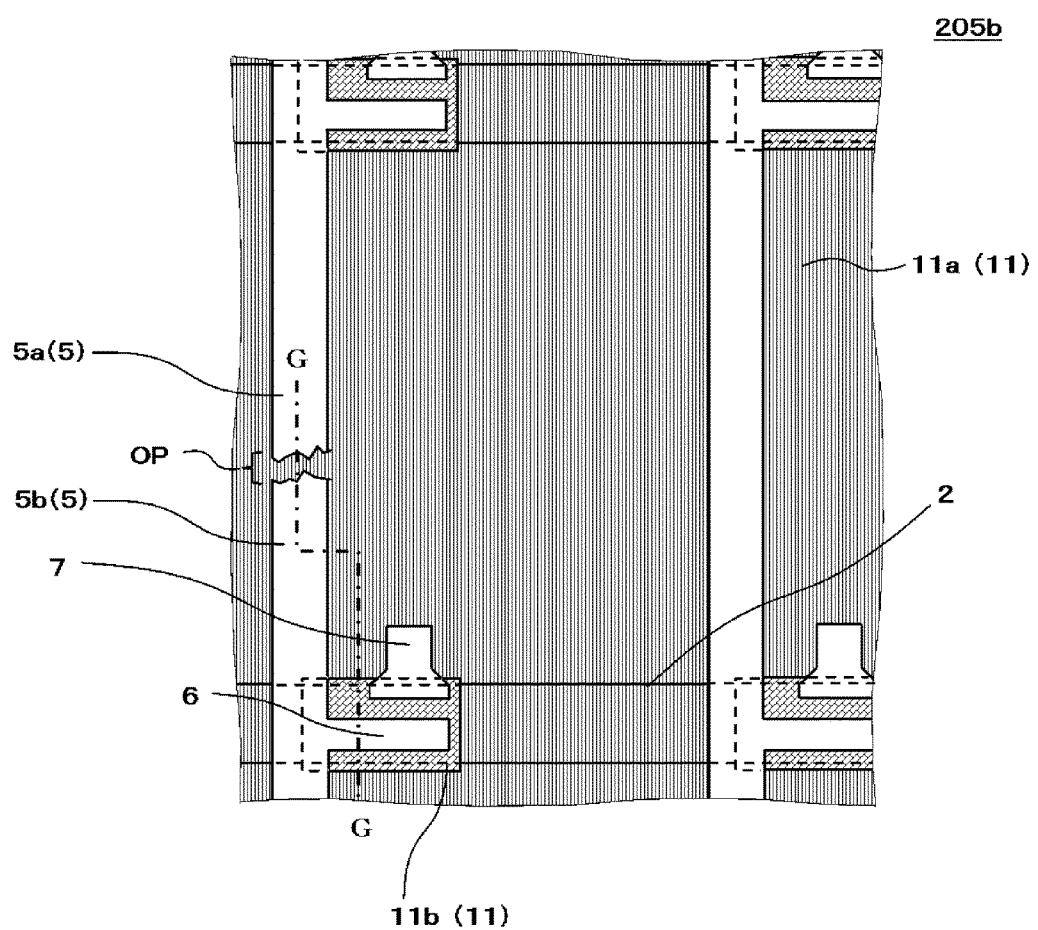
FIG. 60 is a top view illustrating a TFT array substrate according to the sixth embodiment of this disclosure.

FIG. 60 is a top view illustrating a TFT array substrate 205b according to the sixth embodiment of this disclosure. FIG. 60 corresponds to the TFT array substrate 205a of FIG. 59 in a stage before forming the insulation film 10, the interlayer insulation film 14, the contact hole 8 and the pixel electrode 9.

Figure 66:
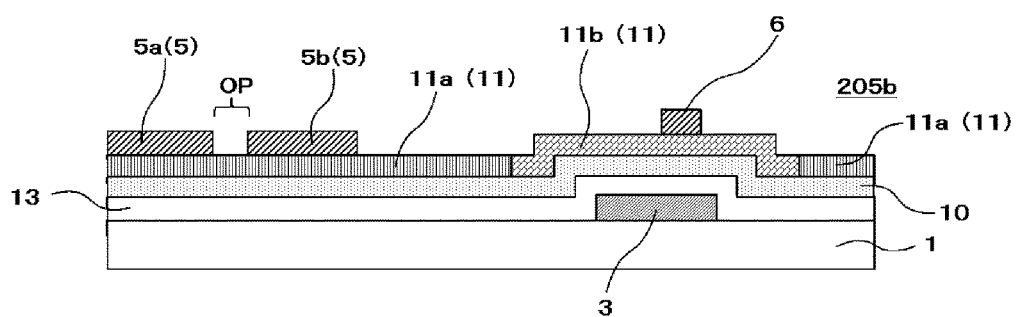
FIG. 66 is a cross-sectional view illustrating the TFT array substrate according to the sixth embodiment of this disclosure.

FIG. 66 is a cross-sectional view of the TFT array substrate 205b according to the sixth embodiment of this disclosure. FIG. 66 is the cross-sectional view taken along line G-G including a section in parallel to a longitudinal direction of the source wiring film 5 in FIG. 60. In the configuration of the TFT array substrate according to the sixth embodiment of this disclosure in the case of having the disconnection part OP, as shown in FIG. 66, the source wiring film 5 is separated in the longitudinal direction in a manner of interposing the disconnection part OP. Thus, a first source wiring film 5a and a second source wiring film 5b being not in direct contact with the first source wiring film 5a are formed. Since the remaining configuration of this TFT array substrate is the same as that in the case where the disconnection part OP is not formed as shown in FIG. 49, descriptions thereof will be omitted.

Figure 64:
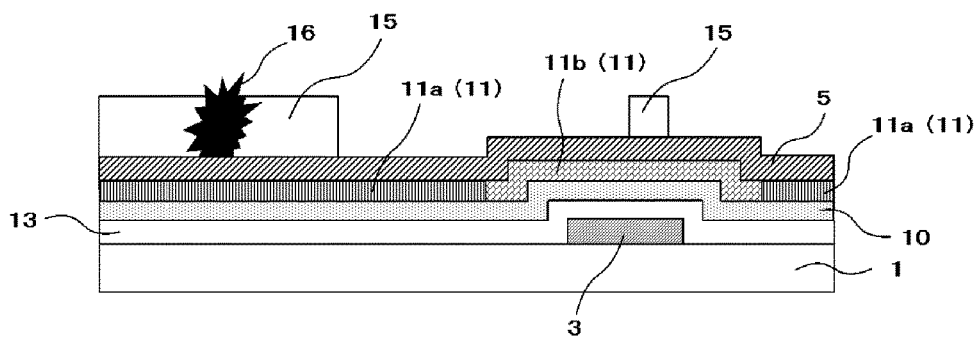
FIG. 64 is a cross-sectional view illustrating a part of the manufacturing process of the TFT array substrate according to the sixth embodiment of this disclosure.
Figure 65:
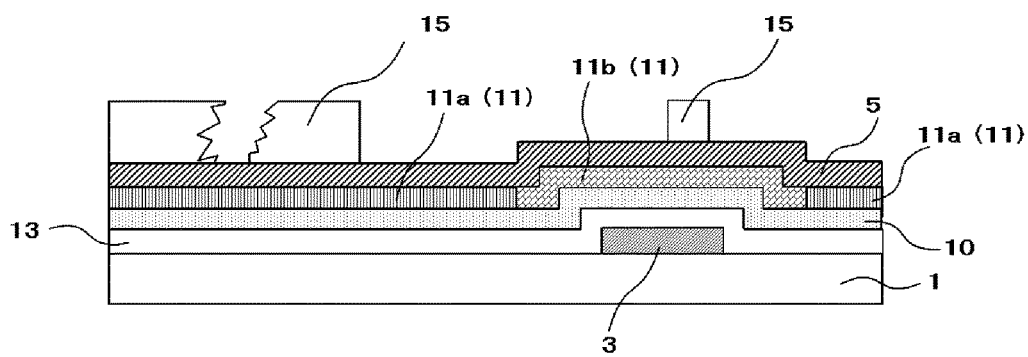
FIG. 65 is a cross-sectional view illustrating a part of the manufacturing process of the TFT array substrate according to the sixth embodiment of this disclosure.

FIGS. 64 and 65 are cross-sectional views illustrating parts of the manufacturing process of the TFT array substrate 205b according to the sixth embodiment of this disclosure. FIG. 64 illustrates a case where foreign particle 16 is incorporated into the resist 15 in the photoengraving process shown in FIG. 57. FIG. 65 is the cross-sectional view illustrating a state that the foreign particle 16 of FIG. 64 peels.

As shown in FIG. 65, if the foreign particle 16 peels off, for example, in a resist developing process or a cleaning process before the etching process, an unintentional portion not covered by the resist 15 appears in the source wiring film. As shown in FIG. 66, at this portion not covered by the resist 15, the source wiring film is etched away and the disconnection part OP appears.

Fourthly, configuration of the TFT array substrate according to the sixth embodiment of this disclosure which is subjected to connection repair in a case where the disconnection part OP is generated at the source wiring film 5 will be described.

Figure 61:
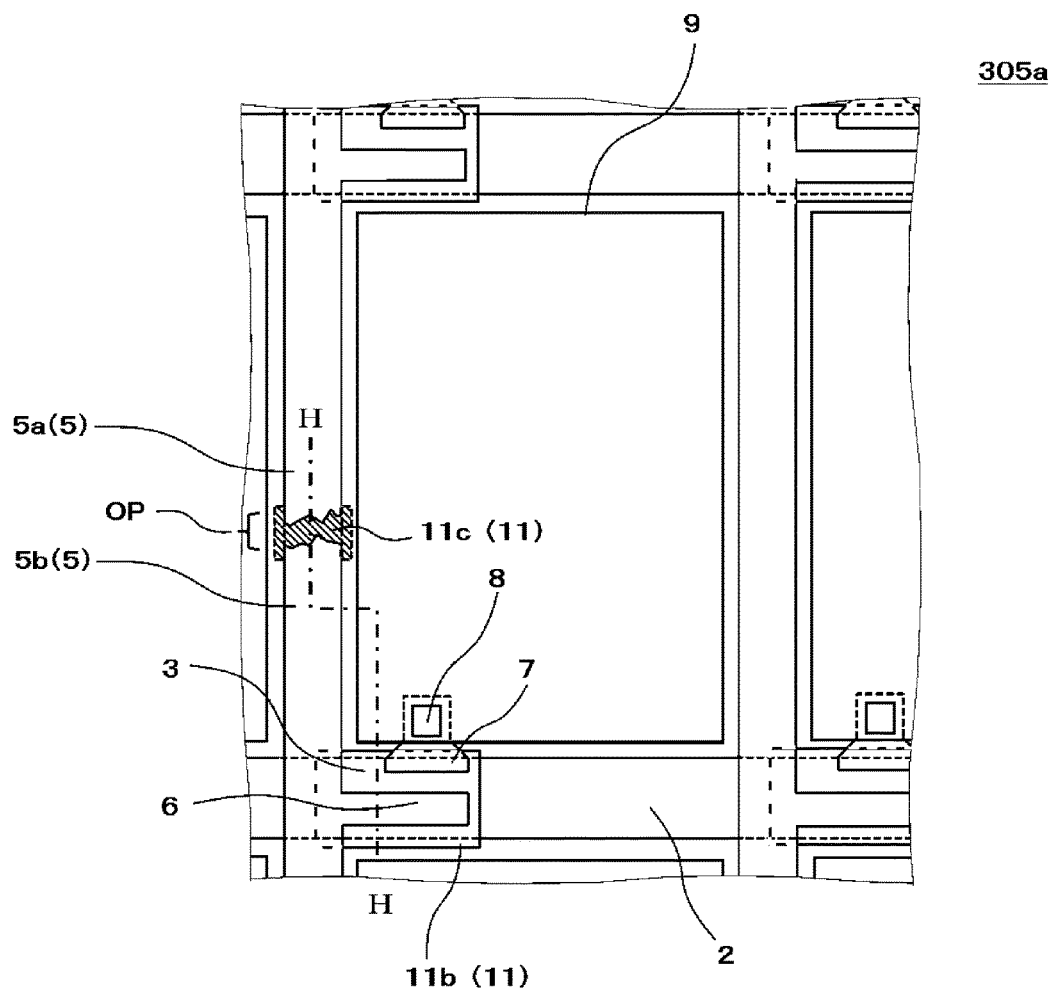
FIG. 61 is a top view illustrating a TFT array substrate according to the sixth embodiment of this disclosure.
Figure 62:
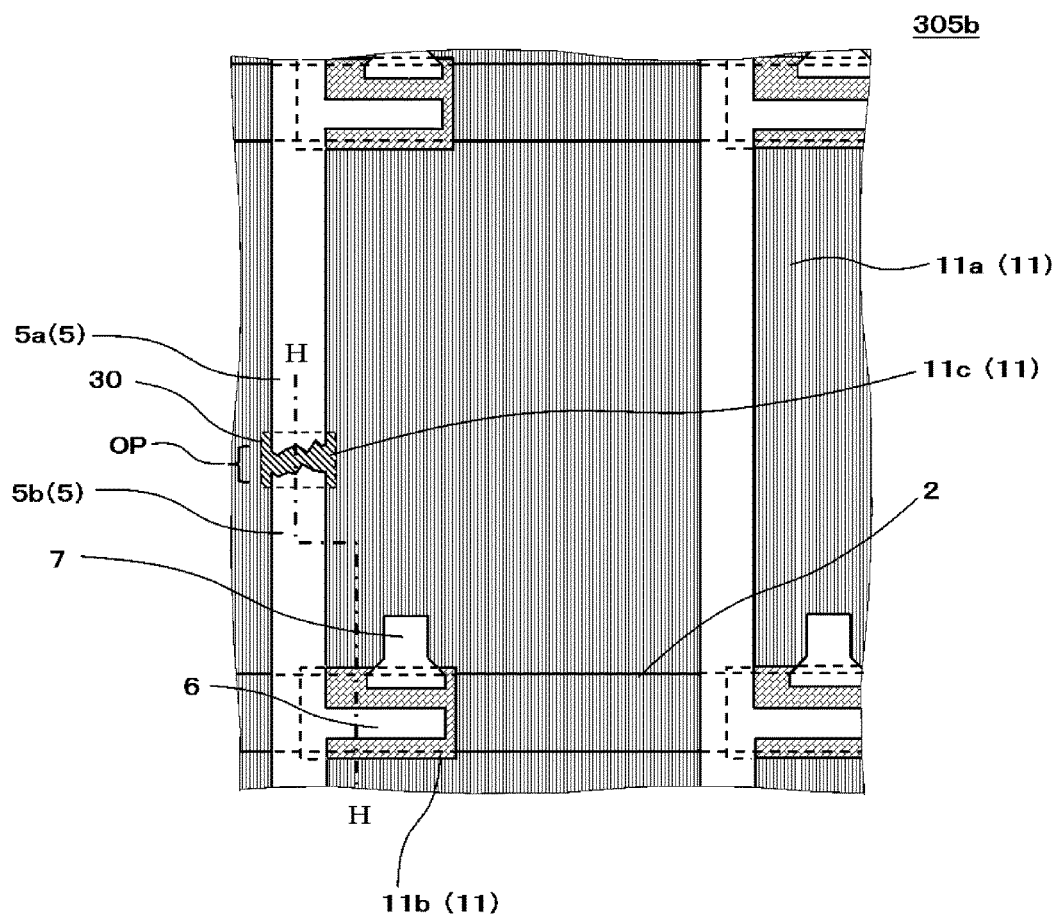
FIG. 62 is a top view illustrating a TFT array substrate according to the sixth embodiment of this disclosure.

FIG. 61 is a top view illustrating a TFT array substrate 305a according to the sixth embodiment of this disclosure. FIG. 62 is a top view illustrating a TFT array substrate 305b according to the sixth embodiment of this disclosure. FIG. 61 illustrates a state where a conductor part 11c, which is formed by changing the oxide semiconductor film into the conductor, is formed at the disconnection part OP of the source wiring film 5 in FIG. 59. FIG. 62 corresponds to a state where the conductor part 11c, which is formed by changing the oxide semiconductor film into the conductor, is formed at the disconnection part OP of the source wiring film 5 in FIG. 60.

Figure 63:
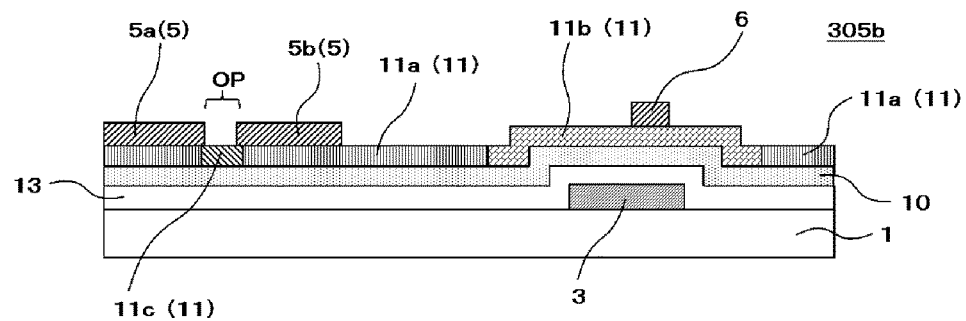
FIG. 63 is a cross-sectional view illustrating the TFT array substrate according to the sixth embodiment of this disclosure.

FIG. 63 is a cross-sectional view of the TFT array substrate 305b according to the sixth embodiment of this disclosure. FIG. 63 is the cross-sectional view taken along line H-H including a section in parallel to a longitudinal direction of the source wiring film 5 in FIG. 62. In addition to the configuration explained with reference to FIG. 66, as shown in FIG. 63, the inorganic film 11 has the conductor part 11c formed by changing the oxide semiconductor into the conductor, and the conductor part 11c is in direct contact with both the first source wiring film 5a and the second source wiring film 5b. Since the remaining configuration of this TFT array substrate is the same as that of the TFT array substrate in the state before forming the conductor part 11c, which is obtained by changing the oxide semiconductor film into the conductor, shown in FIG. 66, descriptions thereof will be omitted.

Figure 67:
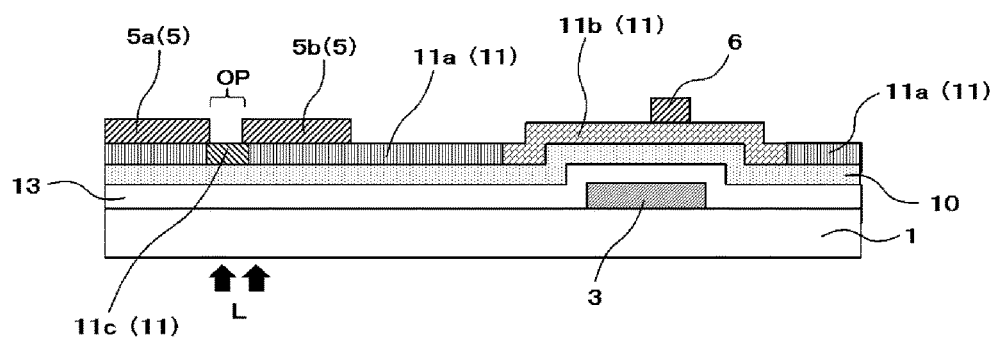
FIG. 67 is a cross-sectional view illustrating a part of the manufacturing process of the TFT array substrate according to the sixth embodiment of this disclosure.

Fifthly, a method of manufacturing the TFT array substrate 305b by subjecting the TFT array substrate 205b according to the sixth embodiment of this disclosure to the connection repair will be described. FIG. 67 is a cross-sectional view illustrating a part of the manufacturing process of the TFT array substrate 305b according to the sixth embodiment of this disclosure. FIG. 67 illustrates the process of irradiating the disconnection part OP with the ultraviolet rays L.

At first, the disconnection part OP is detected by the defect inspection apparatus or the like and the ultraviolet rays L are irradiated on the disconnection part OP, by using the ultraviolet laser. As shown in FIG. 67, the ultraviolet rays L are irradiated in a direction toward the inorganic film 11 from the glass substrate 1, that is, toward the disconnection part OP from the rear surface side of the glass substrate 1. The ultraviolet rays L transmit the glass substrate 1 and are irradiated on the insulation film 10 and the insulator part 11a of the inorganic film 11.

Figure 68:
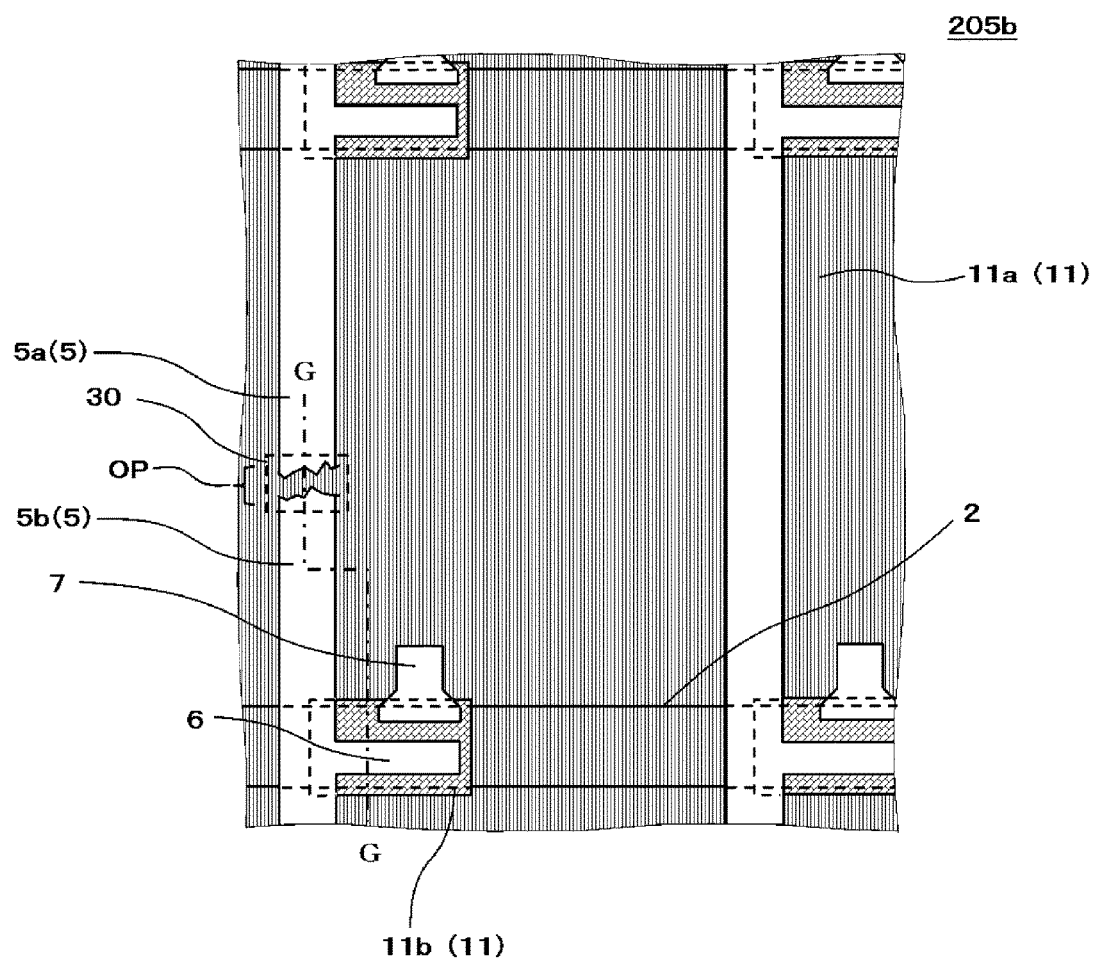
FIG. 68 is a top view illustrating the TFT array substrate according to the sixth embodiment of this disclosure.

FIG. 68 is a top view illustrating the TFT array substrate 205b according to the sixth embodiment of this disclosure. FIG. 68 illustrates a range 30 on which the ultraviolet rays L are irradiated, at a time of manufacturing the TFT array substrate 305b by subjecting the TFT array substrate 205b according to the sixth embodiment of this disclosure to the connection repair. The range 30 on which the ultraviolet rays L are irradiated is, for example, a range surrounding the disconnection part OP as shown in FIG. 68.

When the ultraviolet rays L are irradiated on a portion where the insulator part 11a, which is formed by changing the oxide semiconductor film into the insulator, is in direct contact with the insulation film 10 made of the silicon oxide (SiO$_2$) film, in particular effectively, electronic carriers of the oxide semiconductor film are excited, and thus a specific resistance value of the oxide semiconductor film reduces. Thus, the insulator part 11a is changed into the conductor, whereby the conductor part 11c is formed. Since the conductor part 11c formed by changing the oxide semiconductor into the conductor is in direct contact with both the first source wiring film 5a and the second source wiring film 5b, the first source wiring film 5a and the second source wiring film 5b are electrically conducted to each other via the oxide semiconductor film that is changed into the conductor. Since the connection repair is performed in this manner, the oxide semiconductor film that is changed into the conductor directly fits to the first source wiring film 5a and the second source wiring film 5b. Thus, conduction failure can be reduced as compared with the conventional art (see FIGS. 62 and 63).

Figure 69:
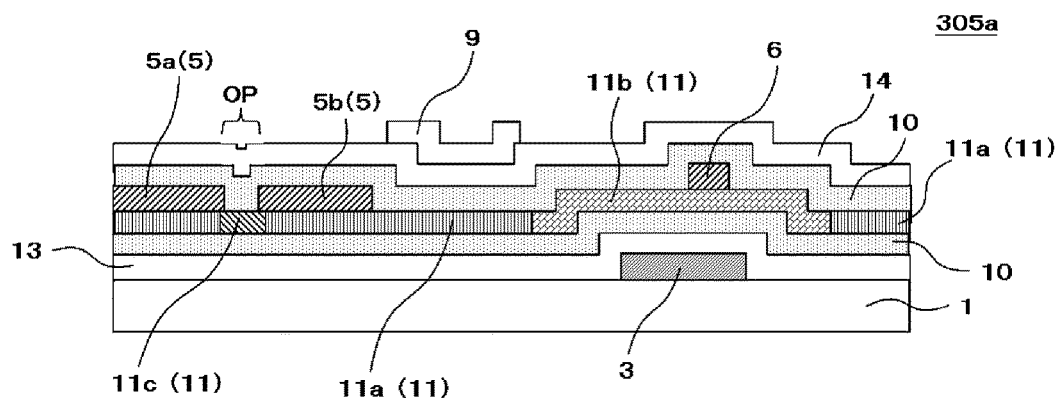
FIG. 69 is a cross-sectional view illustrating the TFT array substrate according to the sixth embodiment of this disclosure.

By performing the connection repair in this manner, the TFT array substrate 305b shown in FIGS. 62 and 63 is obtained. FIG. 69 is a cross-sectional view of the TFT array substrate 305a according to the sixth embodiment of this disclosure. Thereafter, the insulation film 10, the interlayer insulation film 14, the contact hole 8 and the pixel electrode 9 are formed, and thus the TFT array substrate 305a shown in FIGS. 61 and 69 is obtained.

Figure 70:
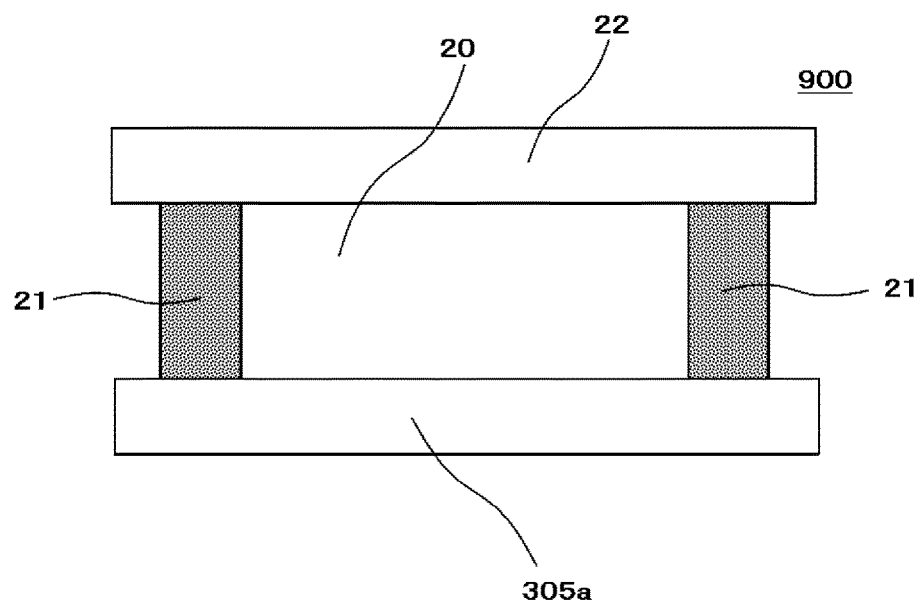
FIG. 70 is a cross-sectional view illustrating a liquid crystal display device according to the sixth embodiment of this disclosure.

FIG. 70 is a diagram illustrating a liquid crystal display device 900 according to the sixth embodiment of this disclosure. After forming the oriented film, etc., as shown in FIG. 70, the CF substrate 22 is laminated on the TFT array substrate 305a via the seal member 21, and the liquid crystal 20 is filled in a region surrounded by the TFT array substrate 305a, the CF substrate 22 and the seal member 21, whereby the liquid crystal display device 900 as the display device is formed.

In The TFT array substrate and the liquid crystal display device according to the sixth embodiment of this disclosure, the inorganic film 11 has the semiconductor part 11b formed of the oxide semiconductor. Thus, each of the semiconductor part 11b forming the TFT 12b and the insulator part 11a, which is formed by changing the oxide semiconductor into the insulator and enables the connection repair of the source wiring film 5, can be formed by merely changing the property of the oxide semiconductor. Consequently the processing can be simplified and the productivity can be improved.

According to the manufacturing method of the TFT array substrate and the manufacturing method of the liquid crystal display device according to the sixth embodiment of this disclosure, in the process of forming the insulator part 11a, the semiconductor part 11b is formed by changing a part of the oxide semiconductor film into the insulator. Thus, each of the semiconductor part 11b forming the TFT 12b and the insulator part 11a, which is formed by changing the oxide semiconductor into the insulator and enables the connection repair of the source wiring film 5, can be formed by merely changing the property of the oxide semiconductor. Consequently the processing can be simplified and the productivity can be improved.

As described above, in each of the first to sixth embodiments according to this disclosure, the explanation is made as to the case where the connection repair is performed by irradiating with the ultraviolet rays L after forming the source wiring film 5. However even in a state where the CF substrate 22 is laminated on the TFT array substrate via the seal member 21, then the liquid crystal 20 is filled in the region surrounded by the TFT array substrate, the CF substrate 22 and the seal member 21 and thus the liquid crystal display device as the display device is formed, the connection repair also can be performed similarly by irradiating with the ultraviolet rays L in a direction toward the inorganic film 11 from the TFT array substrate, that is, toward the disconnection part OP from the rear surface side of the TFT array substrate. Incidentally, although an intensity of the ultraviolet rays L reduces due to the CF substrate, etc., the ultraviolet rays L may be irradiated from the CF substrate 22 side. In this case, the connection repair can also be performed. Thus, the process of performing the connection repair can be set in various manners and the efficiency of the manufacturing process can be improved advantageously.

In each of the first to sixth embodiments according to this disclosure, the explanation is made as to the case where the CF substrate is used as a counter substrate facing the TFT array substrate, but a CF substrate for monochrome display may be used. Alternatively, a CF substrate not containing a color filter may be used.

In each of the first to sixth embodiments according to this disclosure, the explanation is made as to the case where the connection repair is applied to the unintentional OP part in view of the manufacturing and designing reasons of the wring film. However the connection repair may be applied to an intentionally formed disconnection part in view of the manufacturing and designing reasons of the wring film such as a selection wiring for circuit correction.

What is claimed is:

1. A method of manufacturing a substrate for a display device, comprising:
   forming, on an insulation substrate, an insulation film, which is primarily made of one of silicon oxide and oxidized metal;
   forming an inorganic film, which has an insulator part that is formed by changing an oxide semiconductor into an insulator, to be in direct contact with the insulation film; and
   forming a wiring film to be in direct contact with the insulator part, wherein
   the insulator has a specific resistance of $1 \times 10^6 \Omega \cdot cm$ or more,
   the forming the inorganic film is performed after the forming the wiring film, and
   the forming the insulation film is performed after the forming the inorganic film.

2. The method of manufacturing the substrate for the display device according to claim 1,
   wherein, in the forming the insulation film, the insulation film is formed in a manner where the insulation film contains, in a planar view, the wiring film in a transversal direction of the wiring film.

3. The method of manufacturing the substrate for the display device according to claim 1,
   wherein forming the inorganic film includes:
   forming a film of the oxide semiconductor; and
   forming the insulator part by changing the film of the oxide semiconductor into the insulator after the forming the film of the oxide semiconductor.

4. The method of manufacturing the substrate for the display device according to claim 3,
   wherein, in the forming the insulator part, the insulator part is formed by changing only a part of the film of the oxide semiconductor into the insulator.

5. A method of manufacturing a substrate for a display device, comprising:
   forming, on an insulation substrate, an inorganic film, which has an insulator part that is formed by changing an oxide semiconductor into an insulator, such that the insulator part is in direct contact with the insulation substrate;
   forming a wiring film to be in direct contact with the insulator part; and
   forming an insulation film, which is primarily made of one of silicon oxide and oxidized metal, to be in direct contact with the wiring film, wherein
   the insulator has a specific resistance of $1 \times 10^6 \Omega \cdot cm$ or more.

6. The method of manufacturing the substrate for the display device according to claim 5,
   wherein the forming the wiring film is performed after the forming the inorganic film, and
   wherein the forming the insulation film is performed after the forming the wiring film.

7. The method of manufacturing the substrate for the display device according to claim 5,
   wherein forming the inorganic film includes:
   forming a film of the oxide semiconductor; and
   forming the insulator part by changing the film of the oxide semiconductor into the insulator after the forming the film of the oxide semiconductor.

8. The method of manufacturing the substrate for the display device according to claim 7,
   wherein, in the forming the insulator part, the insulator part is formed by changing only a part of the film of the oxide semiconductor into the insulator.

9. A method of manufacturing a substrate for a display device, comprising:
   forming, on an insulation substrate, an insulation film, which is primarily made of one of silicon oxide and oxidized metal;
   forming an inorganic film, which has an insulator part that is formed by changing an oxide semiconductor into an insulator, to be in direct contact with the insulation film; and
   forming a wiring film to be in direct contact with the insulator part,
   wherein the forming the wiring film includes:
   forming the wiring film having a first wiring film and a second wiring film being not in direct contact with the first wiring film, and
   forming a conductor part by changing the oxide semiconductor into a conductor, which is formed to be in direct contact with the first wiring film and the second wiring film.

10. The method of manufacturing the substrate for the display device according to claim 9,
    wherein, in the forming the conductor part, the conductor part is formed by irradiating with ultraviolet rays on the insulation film and the inorganic film.

11. The method of manufacturing the substrate for the display device according to claim 10,
    wherein, in the forming the conductor part, the ultraviolet rays are irradiated in a direction toward the insulation substrate from the inorganic film.

12. The method of manufacturing the substrate for the display device according to claim 10,
    wherein the substrate is made of a material, which transmits the ultraviolet rays, and
    wherein, in the forming the conductor part, the ultraviolet rays are irradiated in a direction toward the inorganic film from the insulation substrate.

13. The method of manufacturing the substrate for the display device according to claim 10,
    wherein the ultraviolet rays are irradiated by at least one of an ultraviolet lamp, an ultraviolet LED or an ultraviolet laser.

14. The method of the substrate for the display device according to claim 10,
    wherein the oxide semiconductor is one of InGaZnO-based, InZnO-based, InGaO-based, InSnO-based, InSnZnO-based, InGaZnSnO-based, InAlZnO-based, InHfZnO-based, InZrZnO-based, InMgZnO-based and InYZnO-based oxide semiconductor.

15. A method of manufacturing a display device comprising:
    the method of manufacturing the substrate according to claim 10.

16. A method of manufacturing a substrate for a display device, comprising:
    forming, on an insulation substrate, an inorganic film, which has an insulator part that is formed by changing an oxide semiconductor into an insulator;
    forming a wiring film to be in direct contact with the insulator part; and
    forming an insulation film, which is primarily made of one of silicon oxide and oxidized metal, to be in direct contact with the wiring film, wherein
    the insulator has a specific resistance of $1 \times 10^6$ $\Omega \cdot cm$ or more, the forming the wiring film is performed after the forming the insulation film, and the forming the inorganic film is performed after the forming the wiring film.

17. The method of manufacturing the substrate for the display device according to claim 16, wherein forming the inorganic film includes:

forming a film of the oxide semiconductor; and forming the insulator part by changing the film of the oxide semiconductor into the insulator after the forming the film of the oxide semiconductor.

18. The method of manufacturing the substrate for the display device according to claim 17, wherein, in the forming the insulator part, the insulator part is formed by changing only a part of the film of the oxide semiconductor into the insulator.

* * * * *